(12) United States Patent
Huh

(10) Patent No.: US 11,120,992 B2
(45) Date of Patent: Sep. 14, 2021

(54) METHOD OF FABRICATING SEMICONDUCTOR DEVICE

(71) Applicant: XIA TAI XIN SEMICONDUCTOR (QING DAO) LTD., Qingdao (CN)

(72) Inventor: Min Huh, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/679,340

(22) Filed: Nov. 11, 2019

(65) Prior Publication Data

US 2021/0143012 A1    May 13, 2021

(51) Int. Cl.
*H01L 27/108* (2006.01)
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 27/10888* (2013.01)

(58) Field of Classification Search
CPC ............. H01L 21/0338; H01L 21/0332; H01L 21/0335
See application file for complete search history.

(56) References Cited

U.S. PATENT DOCUMENTS

2015/0318172 A1* 11/2015 Huang ................ H01L 21/3086
                                                                       438/696
2020/0219763 A1* 7/2020 Ren .................... H01L 21/76832

* cited by examiner

*Primary Examiner* — Timor Karimy
(74) *Attorney, Agent, or Firm* — ScienBiziP, P.C.

(57) ABSTRACT

A method is disclosed, which comprises forming a mid layer over a mask stack that is over a device layer of a substrate; forming a first buffer layer on the mid layer and a plurality pairs of first linear patterns over the first buffer layer; deposing a spin on hard mask layer filling between the first linear patterns; forming a second buffer layer on the spin on hard mask layer and a plurality of second linear patterns on the second buffer layer that projectively intercepts the first linear patterns; performing a mid layer opening process by concurrently etching the second buffer layer, the spin on hard mask layer, and the first buffer layer through the first and the second linear patterns to partially expose the mid layer; and etching the exposed portions of the mid layer to form a grid-type pattern over the mask stack.

20 Claims, 26 Drawing Sheets

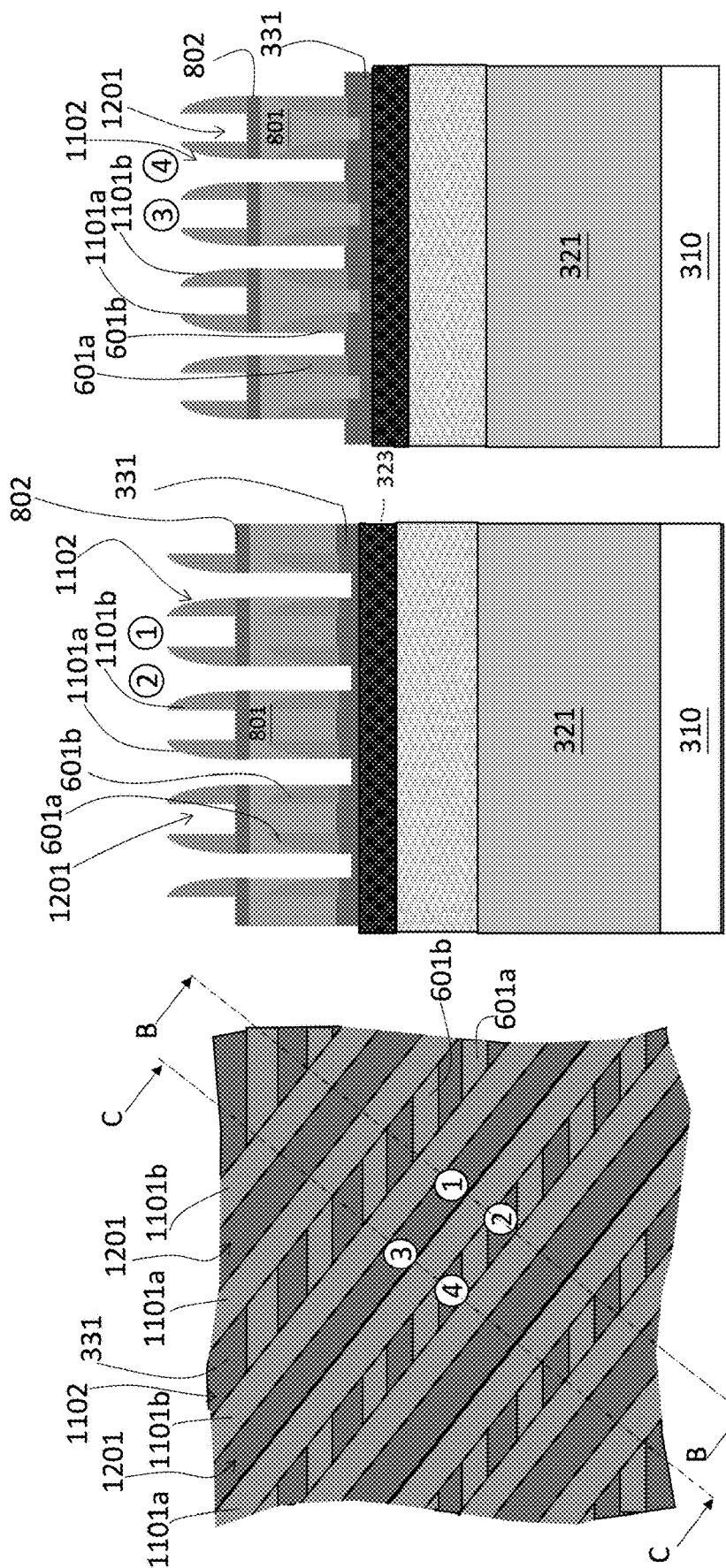

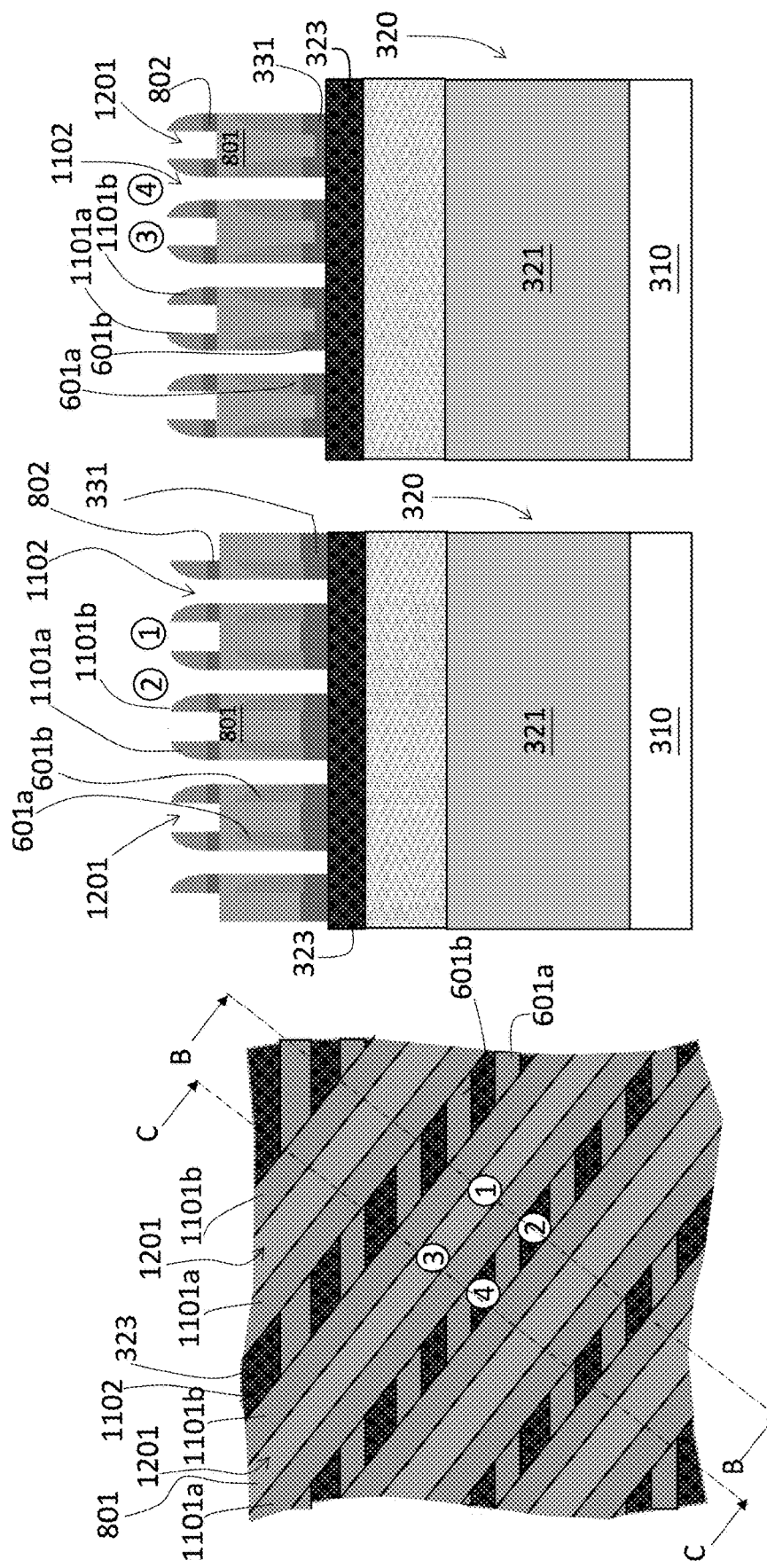

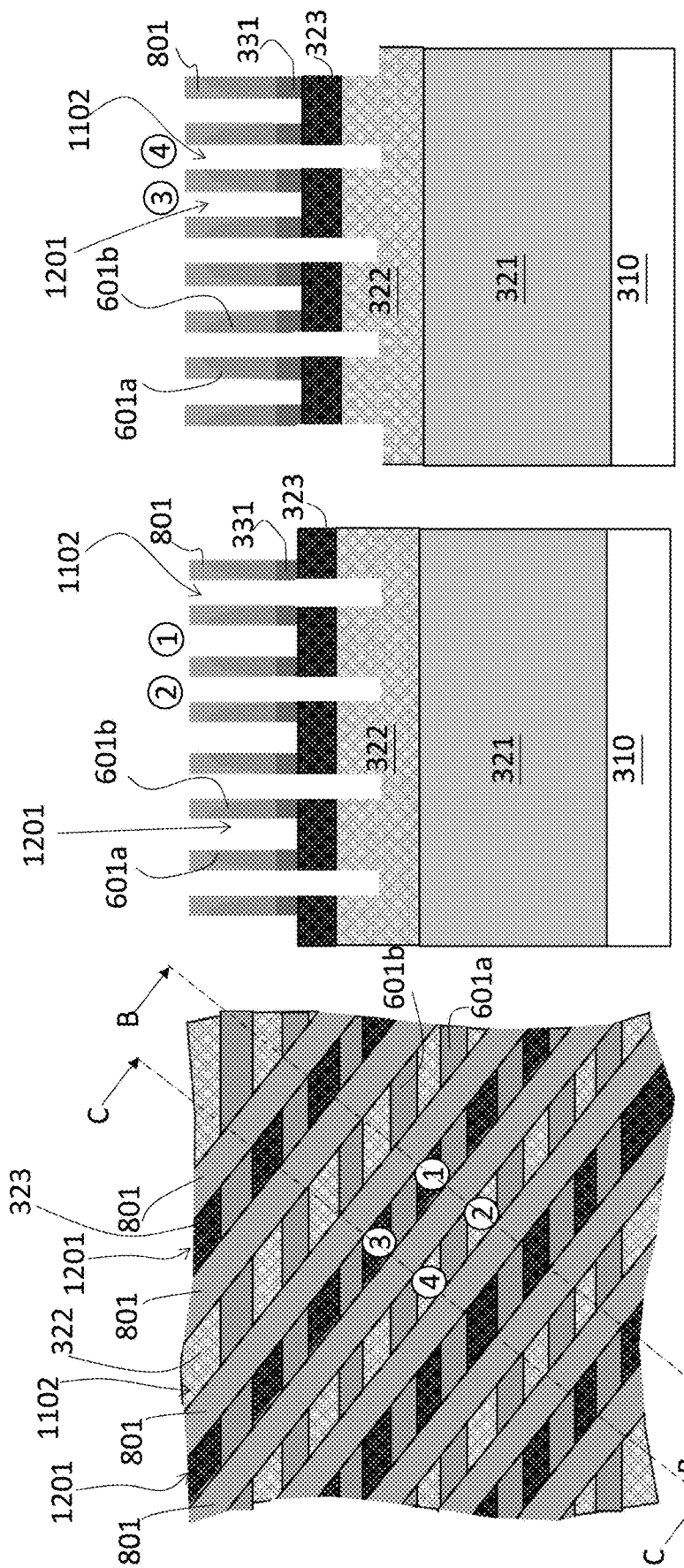

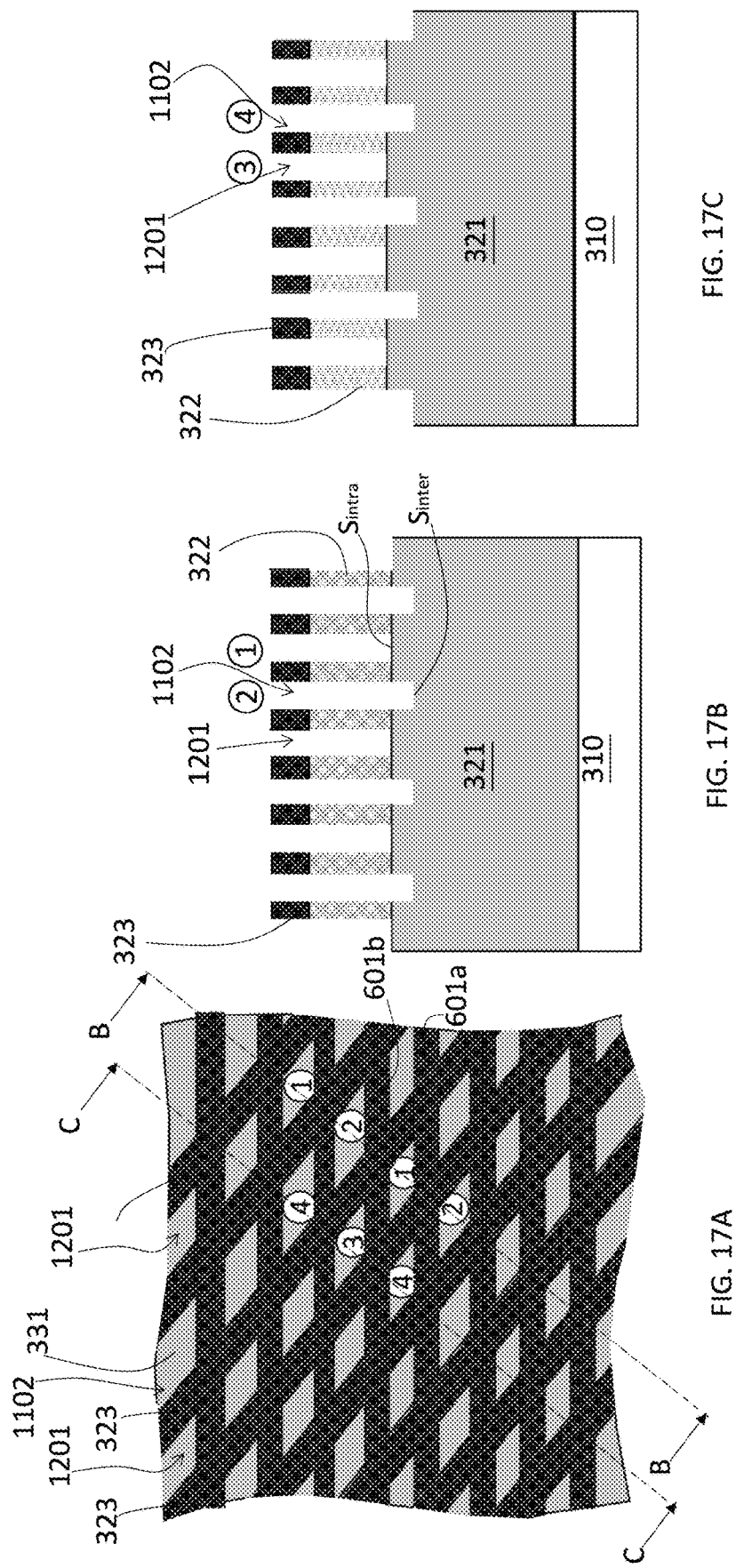

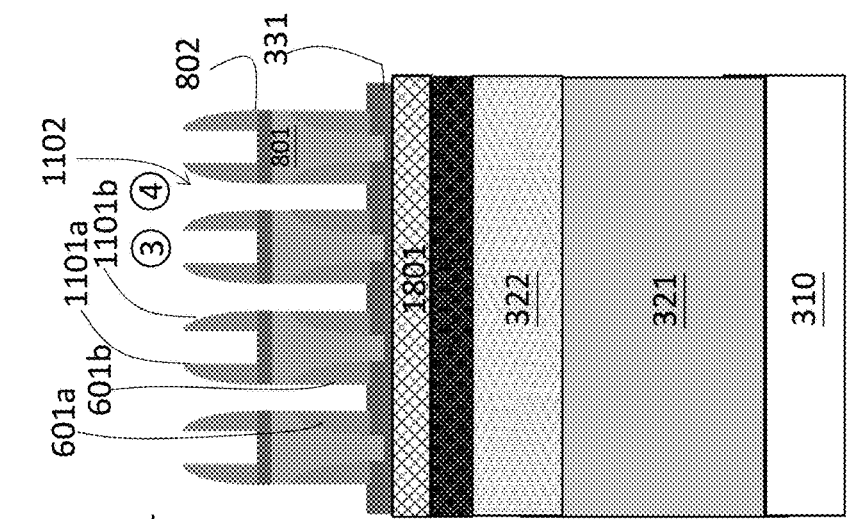
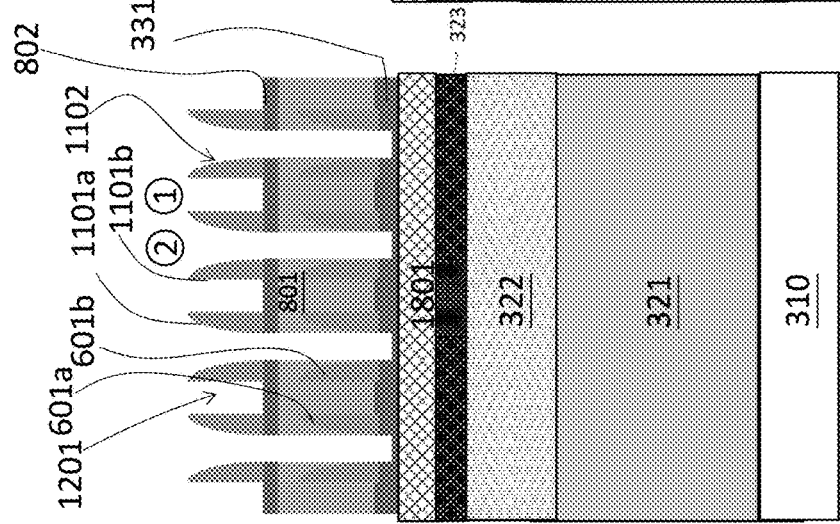
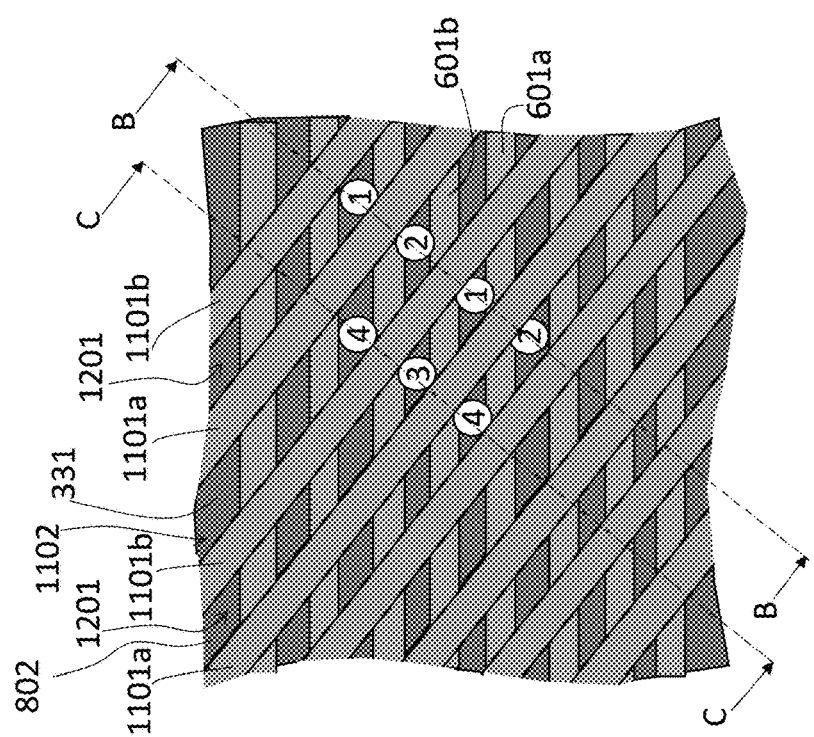
FIG. 20C
FIG. 20B
FIG. 20A

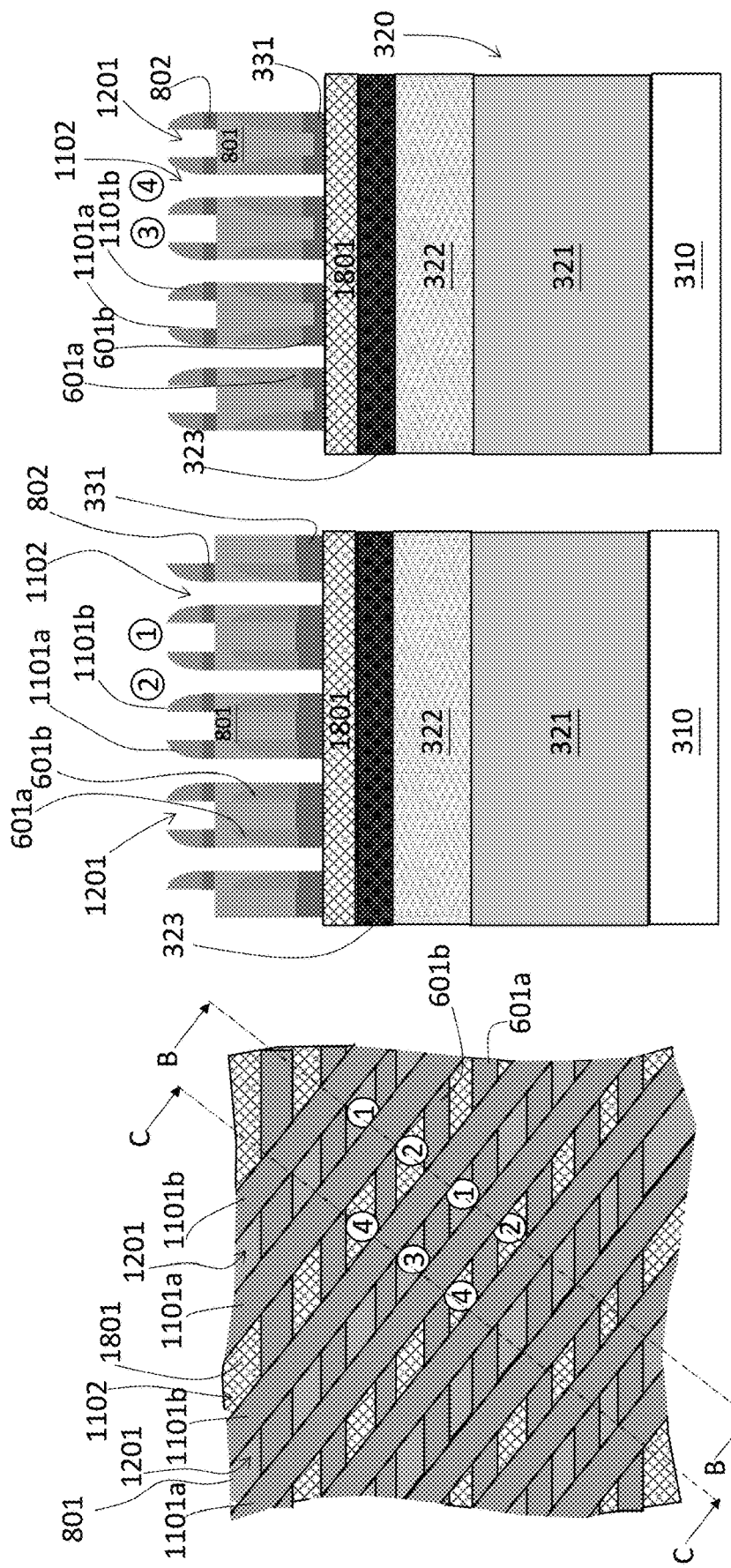

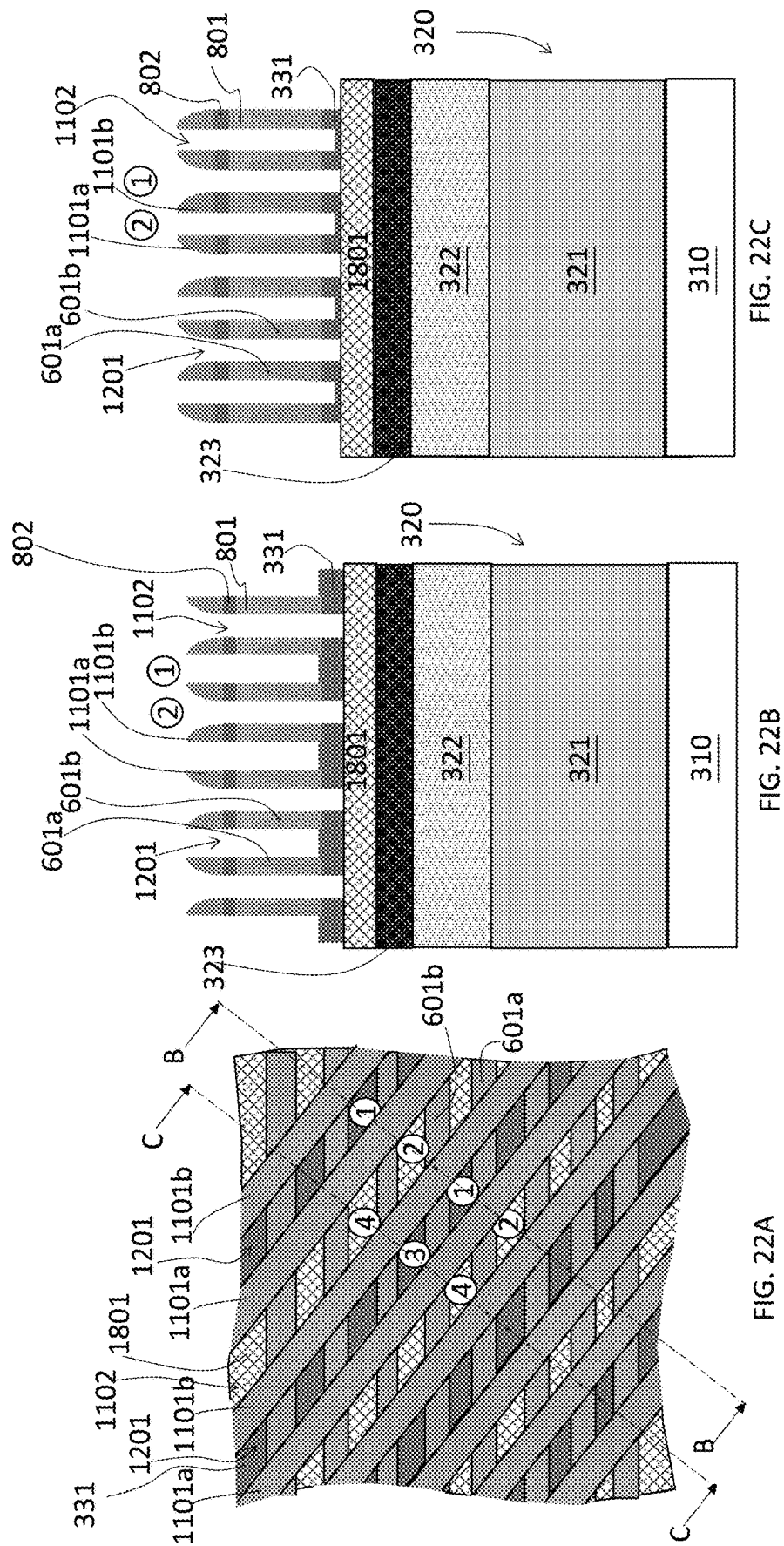

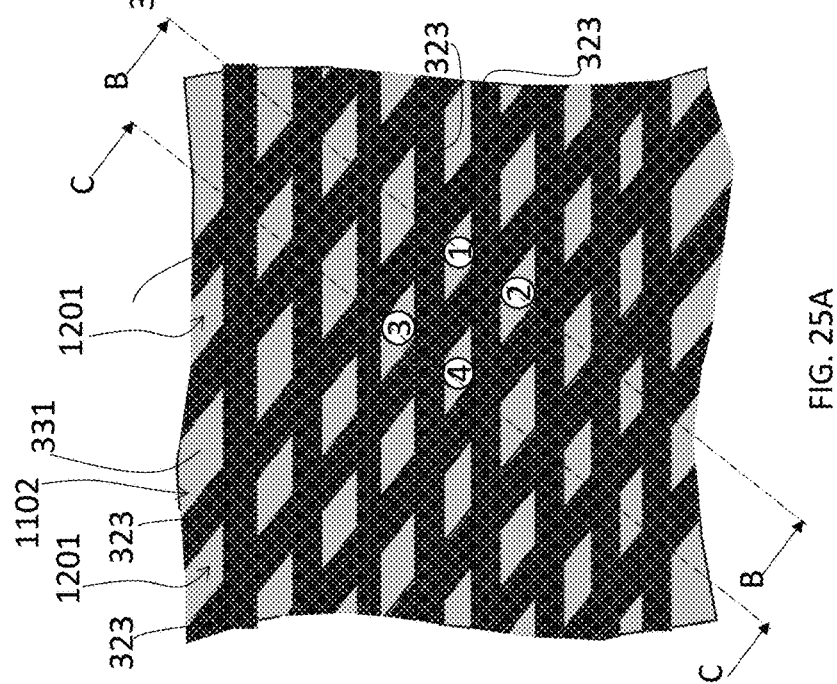
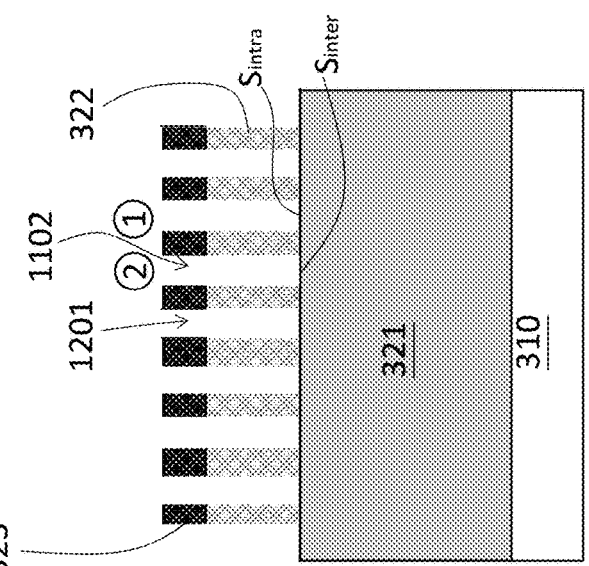
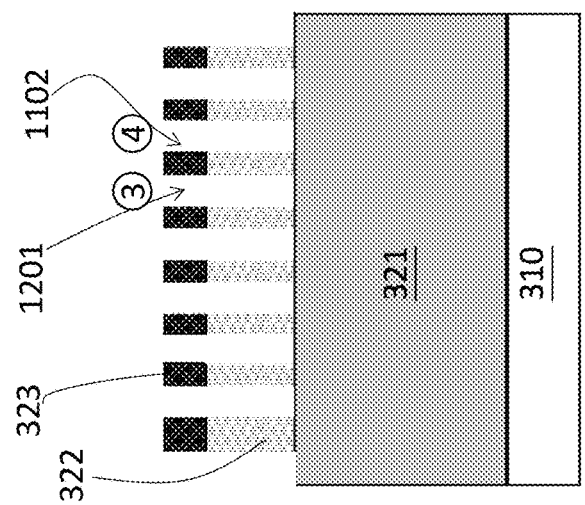
FIG. 25A
FIG. 25B
FIG. 25C

METHOD OF FABRICATING SEMICONDUCTOR DEVICE

FIELD

The present disclosure generally relates to method of fabricating semiconductor device, more specifically to method utilizing double patterning technique.

BACKGROUND

Modern integrated circuits (IC) are designed to encompass millions of components such as transistors, capacitors, resistors with high device density. The demand for higher degree of horizontal integration may be achieved through performing certain patterning technique. By ways of example, double patterning technique may be applied in the formation of line features, spacer features, contact features, and/or recess features in memory devices such as Dynamic random-access memory (DRAM).

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A, 4A, 5A, 6A, 7A, 8A, 9A, 10A, 11A, 12A, 13A, 14A, 15A, 16A, 17A illustrate plan views of intermediate stages of fabricating semiconductor device in accordance with some embodiments of the instant disclosure.

FIGS. 3B, 4B, 5B, 6B, 7B, 8B, 9B, 10B, 11B, 12B, 13B, 14B, 15B, 16B, 17B illustrate cross section views of intermediate stages of fabricating semiconductor device in accordance with some embodiments of the instant disclosure.

FIGS. 11C, 12C, 13C, 14C, 15C, 16C, 17C illustrate cross section views of intermediate stages of fabricating semiconductor device in accordance with some embodiments of the instant disclosure.

FIGS. 18A, 19A, 20A, 21A, 22A, 23A, 24A, 25A illustrate plan views of intermediate stages of fabricating semiconductor device in accordance with some embodiments of the instant disclosure.

FIGS. 18B, 19B, 20B, 21B, 22B, 23B, 24B, 25B and 19C, 20C, 21C, 22C, 23C, 24C, 25C illustrate cross section views of intermediate stages of fabricating semiconductor device in accordance with some embodiments of the instant disclosure.

Figure 1:
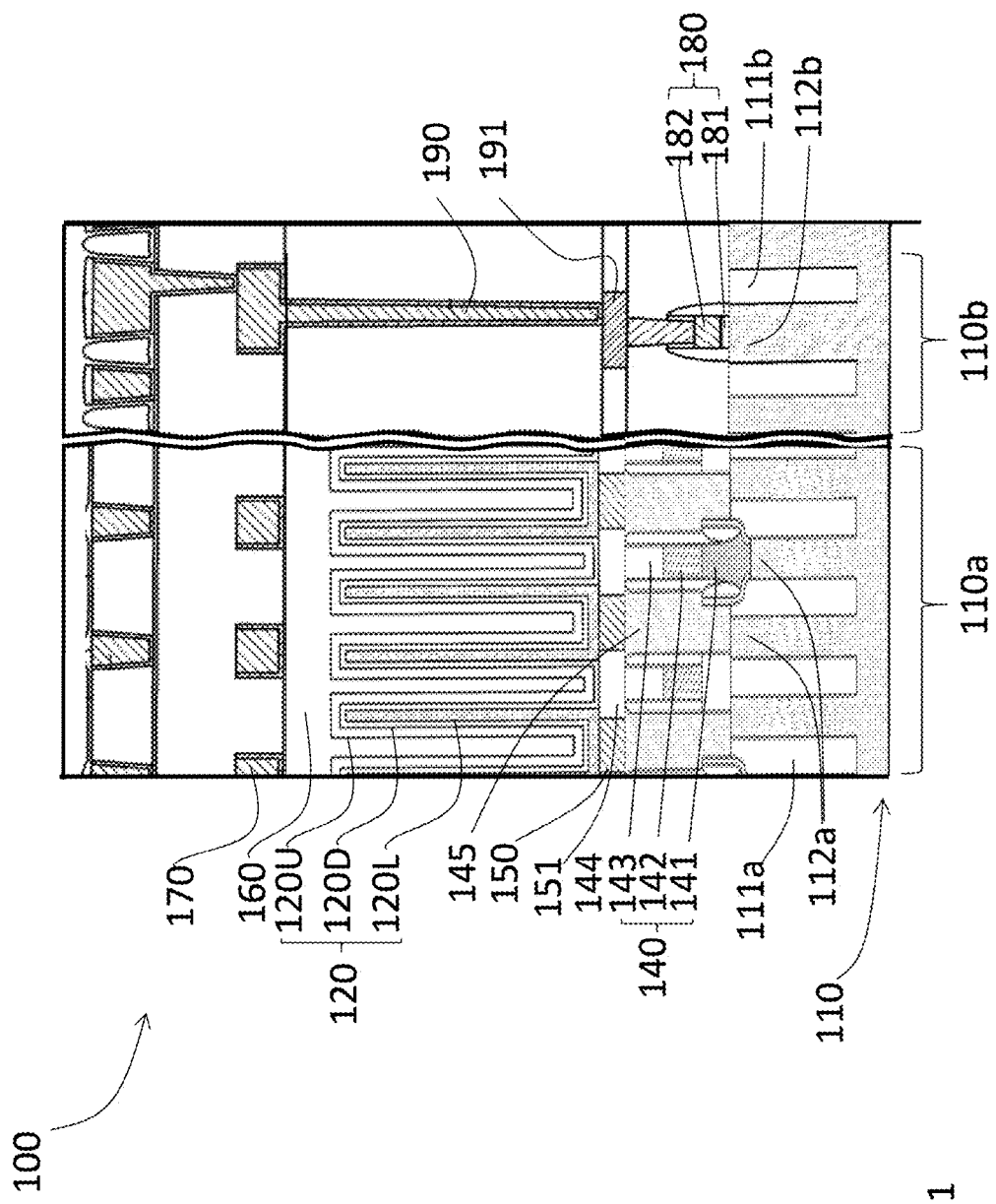
FIG. 1 illustrates a regional cross section view of a semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 25. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a regional cross-sectional view of a semiconductor device 100 in accordance with the instant disclosure. For illustrational simplicity and clarity, some detail/sub components of the exemplary device are not explicitly labeled in the instant figure. The illustrative embodiment of the semiconductor device 100 may be, for example, a Dynamic Random Access Memory (DRAM) device.

The exemplary semiconductor device 100 comprises a semiconductor substrate 110 and multiple layers of integrated circuit devices and features formed on the substrate 110. Several functional regions may be arranged laterally (e.g., horizontally across the page as shown in FIG. 1) over the substrate 110. By way of example, FIG. 1 shows a substrate of an exemplary device that includes two co-planar arranged functional regions defined thereon, e.g., a cell region 110a and a periphery region 110b.

The substrate 110 may comprise a crystalline silicon substrate. The substrate may comprise various doped regions depending on design requirements (e.g., p-type substrate or n-type substrate). The doped regions may be doped with p-type dopant, such as boron or BF2; n-type dopant, such as phosphorus or arsenic; and/or combinations thereof. In some alternative embodiments, the substrate 110 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

The periphery region 110b may comprise various active device regions 112b laterally separated by isolation features, such as shallow trench isolation (STI) 111b. The active region 112b may comprise an active circuit component (e.g., a gate structure 180) that make up the periphery support circuits, e.g., read-out, decoder, or amplifier circuits that controlling memory cells formed in the cell region. Over the active region there may be one or more upper inter device layers, through which contact via 190 may be provided to enable vertical signal conduction (e.g., from the gate structure 180) to a higher device layer. The contact via 190 may be connected to a corresponding contact pad 191 in a fashion similar to that in the cell region 110a. The gate structure 180 may including a gate dielectric 181 on an active region and a gate conductor 182 on the gate dielectric 181.

The cell region 110a may comprise various active device regions 112a laterally separated by isolation features, such as STI 111b.

In the illustrated embodiment, array of memory unit cells may be formed in the cell region 110a of the substrate 110. Each of the memory cell units typically includes a storage element (such as capacitor 120) and a selection device (not shown) such as a transistor.

In the exemplary embodiment, a capacitor 120 includes a lower electrode 120L, a capacitor dielectric 120D lining on the lower electrode 120L, and an upper electrode 120U filling the gaps between the lower electrodes 120L.

In some embodiments, the lower electrode 120L may be a cylindrical or pillar-shaped conductive structure having high aspect ratio (i.e., high depth to width ratio), which corresponds to a tall upward opening U-shaped cross sectional profile (as shown the instant example). The lower electrode 120L may be formed from a conformal conductive film made of one or more conductive material(s) such as BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$).

The capacitor dielectric 120D may be a conformally formed layer that comprises a nitride, an oxide, a metal oxide, or a combination thereof. For example, the capacitor dielectric 120D may include a single or a multilayered film formed from silicon nitride, silicon oxide, a metal oxide (e.g., HfO$_2$, ZrO$_2$, Al$_2$O$_3$, La$_2$O$_3$, Ta$_2$O$_3$, and TiO$_2$), a perovskite dielectric material (e.g., STO (SrTiO$_3$), BST ((Ba,Sr)TiO$_3$), BaTiO$_3$, PZT, and PLZT, or a combination thereof. In some embodiments, high-K dielectric material may be applied to boost capacitor performance, e.g., enhance capacitance for a given electrode surface area.

The upper electrode 120U may be formed of one or more conductive material such as doped semiconductor, conductive metal nitride, metal, metal silicide, conductive oxide, or a combination thereof. For instance, the upper electrode 120U may be formed of conducive material(s) including BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), though the list of suitable material is merely exemplary and not exhaustive.

In the illustrated embodiment, an interlayer insulating layer 160 is formed to cover capacitors (e.g., capacitors 120) over the cell region 110a. Additional conductive features, such as upper metallization feature 170 and additional inter metal dielectric layers may be formed over the interlayer insulating layer 160 and the upper electrode 120U to enable interconnection between circuit elements.

In the illustrated embodiment, several bit line (BL) stack features 140 are formed over the cell region 110a. In practical applications, the BL stack features 140 may be a laterally traversing linear structure (e.g., extending in/out of the page of, e.g., FIG. 1) that projectively intercepts multiple word lines. Each of the BL stack features 140 comprises a BL contact 141, a BL conductor 142, and a BL capping 143. The BL conductor 142 is part of a memory cell selection device that electronically connect to an active region 112a that serve as a source of a selection device through the BL contact 141. The BL contact 141 may be made of conductive material such as poly silicon, metal, or metal silicide. The BL conductor 142 may include conductive material such as poly silicon, metal, or metal silicide.

Although not shown in the cross-sectional diagram illustrated in FIG. 1, a word line may be part of a memory cell selection device. In practical applications, the word line may be a linear structure that projectively intercepts multiple bit lines (e.g., BL stack features 140).

A storage node contact 145 establishes a vertical conductive path connecting the lower electrodes 120L of the capacitors 120 and top surface of active region 112a of the substrate 110 under the lower electrodes 120L. The storage node contacts 145 may be formed by depositing a layer of polysilicon, metal, metal silicide, or metal nitride. Alternatively, the storage node contacts 145 may be formed by forming an epitaxial silicon layer. Differently, the storage node contacts 145 may be formed by forming an epitaxial silicon layer and depositing a metal layer.

A landing pad 150 may be additionally formed to electrically connect the lower electrode 120L to the storage node contact 145. In addition, a landing pad insulating layer 151 may be formed to electrically separate the landing pads 150 from each other.

Figure 2B:
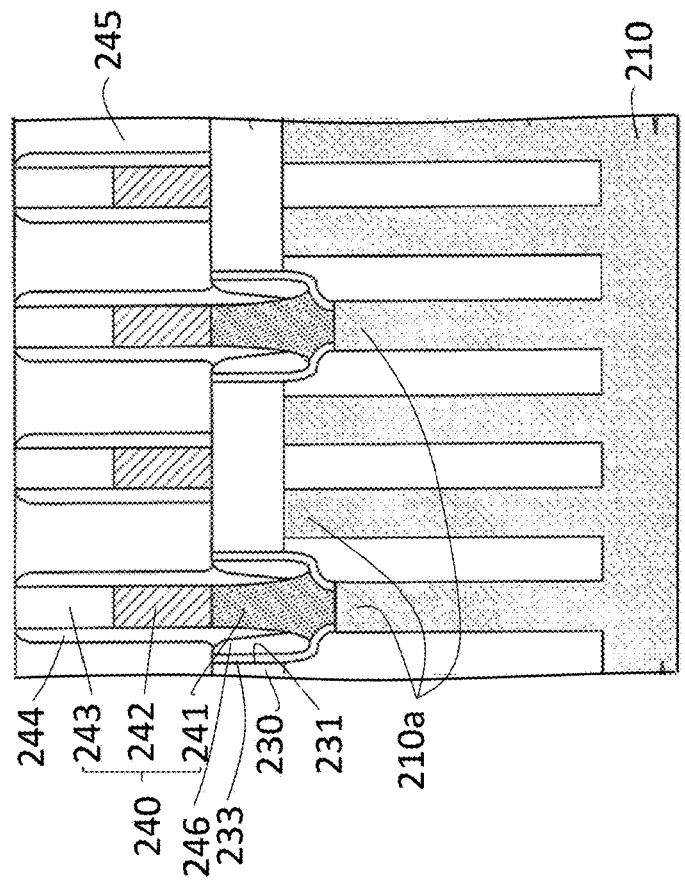
FIGS. 2A and 2B illustrate plan view and cross section view of an intermediate stage of fabricating semiconductor device in accordance with some embodiments of the instant disclosure.
Figure 2A:
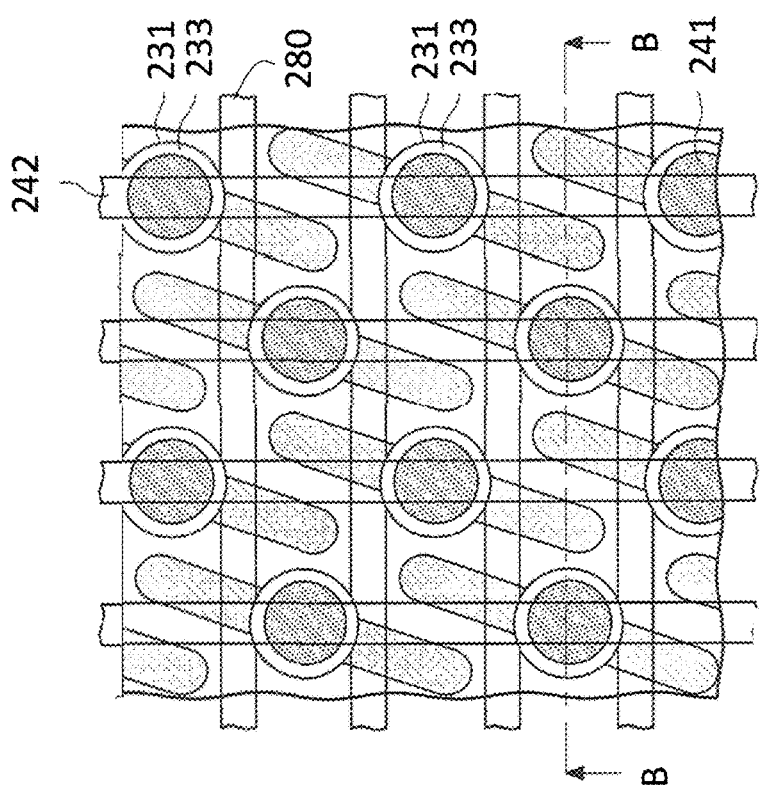

FIGS. 2A and 2B illustrate a plan view and a cross section view of an intermediate stage of fabricating semiconductor device in accordance with some embodiments of the instant disclosure. In particular, FIG. 2B shows a cross section view taken along a cut-line B-B indicated in FIG. 2A.

A substrate 210 may be formed to have active regions 210a. The active regions 210a may have a substantially vertical pillar structure in a cross section (as illustrated in FIG. 2B). Bit line contact holes 231 may be formed. For example, the formation of the bit line contact holes 231 may include forming a interlayer insulating layer 230 and patterning it to expose the active regions 210a.

Insulating liners 233 may be formed in the bit line contact holes 231, respectively. The formation of the insulating liners 233 may include depositing an insulating material (e.g., a silicon oxide layer or a silicon nitride layer) and performing a spacer-forming process including an anisotropic etching step. Each of the insulating liners 233 may cover an inner sidewall of the bit line contact hole 231 and expose top surface of the active region 210a there-under. In some embodiments, the formation of the insulating liners 233 may be omitted.

A bit line stack feature 240 may be formed at a bit line contact hole 231 and electrically connects the corresponding one of the active regions 210a.

For example, the first process of the formation for the bit line stack features 240 may be sequentially disposing a first conductive layer over the substrate 210 and filling the bit line contact hole 231, a second conductive layer over the first conductive layer, and an insulation layer over the first conductive layer. Later, the insulation layer maybe patterned to form a plurality of linear-shaped capping 243. Then, the second and the first conductive layers may be sequentially or concurrently recessed through the capping 243. As such, a bit line stack feature 240 is formed. To be particular, a bit line contact 241 connecting the corresponding active region 210a and a bit line 242 electrically connected to the bit line contact 241 are formed under the capping 243. Each of the bit lines 242 may be patterned into a linear shape and projectively intercepts with several word lines 280. Adjacent ones of the bit lines 242 may be spaced apart from each other. In some embodiments, the first conductive layer may comprise poly silicon. The second conductive layer may comprise conductive material such as tungsten. The insulation layer may comprise silicon nitride. In some embodiments, the first conductive layer may comprise conductive material such as poly silicon, metal, or metal silicide. The second conductive layer may comprise conductive material such as poly silicon, metal, or metal silicide.

An insulating liner (e.g., a silicon oxide layer or a silicon nitride layer) covering the bit line stack feature (e.g., bit line stack features 240) may be deposited and patterned to form pairs of bit line spacer 244 respectively covering side surfaces of bit line stack features. During the formation of the bit line spacers 244, lower spacers 246 may be formed in the bit line contact holes 231, respectively. Several lower spacers 246 may be formed concurrently or by individual processes. Next, a silicon oxide layer or a silicon nitride layer may be deposited to form an interlayer insulating layer 245 that fills gaps between the pairs of bit line spacers 244.

Figure 2D:
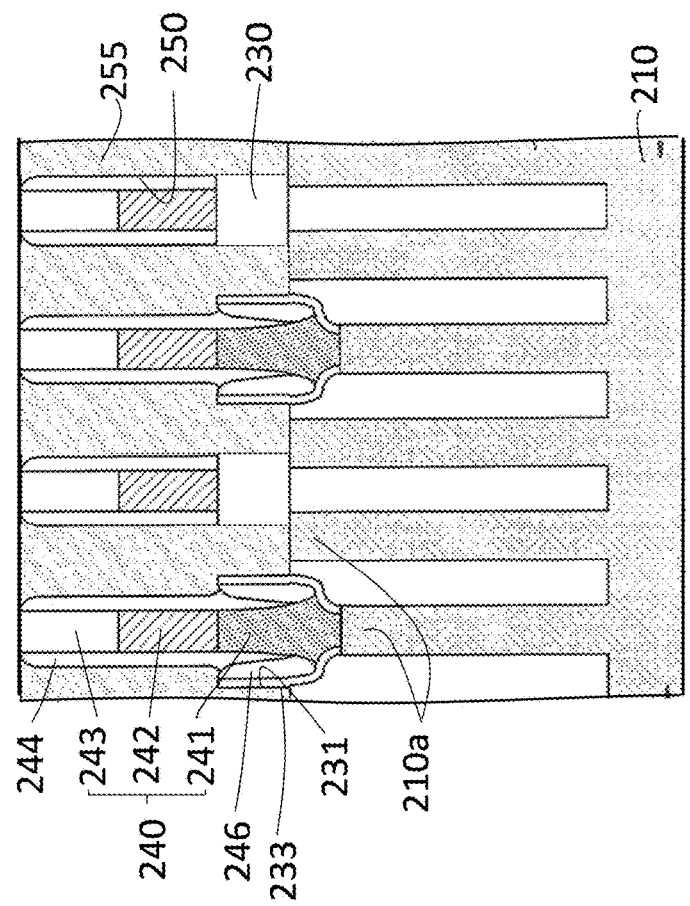
FIGS. 2C and 2D illustrate plan view and cross section view of an intermediate stage of fabricating semiconductor device in accordance with some embodiments of the instant disclosure.
Figure 2C:
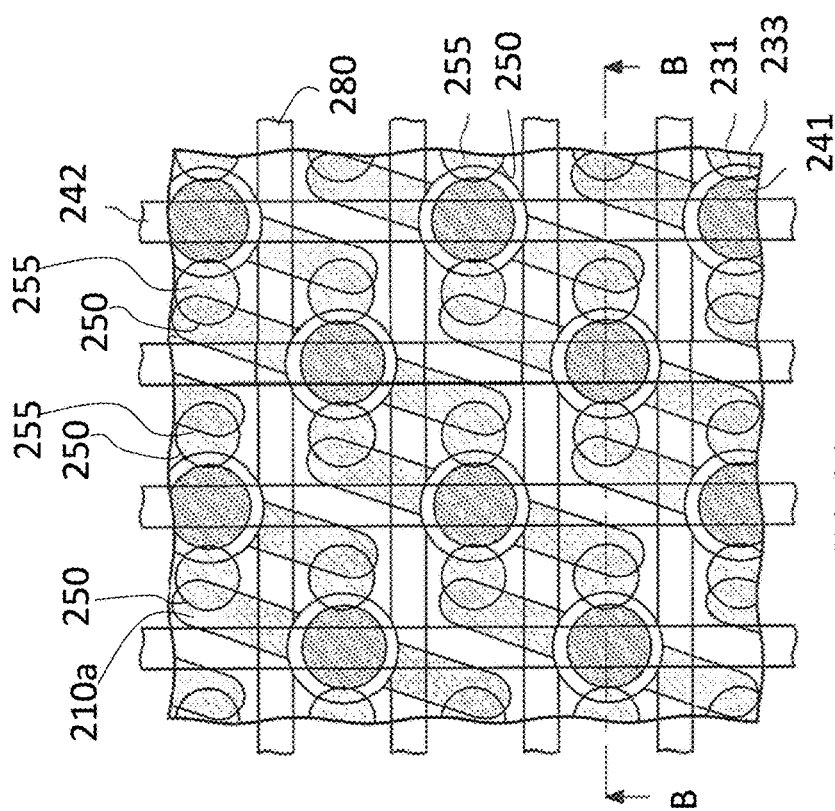

FIGS. 2C and 2D illustrate plan view and cross section view of an intermediate stage of fabricating semiconductor device in accordance with some embodiments of the instant disclosure. FIG. 2D shows an exemplary cross section view taken along a cut-line B-B indicated in FIG. 2C. In particular, FIGS. 2C and 2D show several storage node contacts 255 are formed to be electrically connected to corresponding active regions (e.g., active regions 210a), respectively.

The formation of the storage node contacts 255 may include patterning interlayer insulating layers (e.g., interlayer insulating layer 245 and 230) to form contact holes 250 therethrough and filling the contact holes 250 with a conductive material that sever as the storage node contacts 255. The conductive material may comprise polysilicon, metal, metal silicide, metal nitride, or combinations thereof. In some embodiments, the storage node contacts 255 may be formed of an epitaxially disposed silicon layer. In some embodiments, the storage node contacts 255 may be formed by forming an epitaxial silicon layer and depositing a metal layer. In some scenarios, the contact holes 250 may expose the BL spacers 244 and the lower spacers 233. The BL spacers 244 may separate the bit line contact 241 electrically and spatially from the storage node contact 255 in a horizontal direction.

In a plan view, the contact holes 250 may be arranged in an array, each contact hole 250 separates from neighboring contact holes 250. To enable higher degree of horizontal integration, distance between neighboring contact holes 250 may be reduced. To that end, double patterning technique may be utilized to pattern the contact holes 250 with reduced pitch separation that exceed the resolution limitation of currently adapted photolithography equipment.

FIGS. 3A-18A, 3B-18B, and 11C-18C show exemplary fabrication processes of a semiconductor device 300 in accordance with some embodiments of the instant disclosure.

In particular, the FIGS. 3A-18A, 3B-18B, and 11C-18C show exemplary fabrication processes of patterning an insulation layer (e.g., insulation layer 245) to form contact holes (e.g., contact holes 250) for accommodating storage node contacts (e.g., storage node contacts 255) in accordance with some embodiments of the instant disclosure. The FIGS. 3B-18B are cross-sectional views respectively taken along a cut-line B-B indicated in FIG. 3A-18A. The FIGS. 11C-18C are cross-sectional views respectively taken along a cut-line C-C indicated in FIGS. 11A-18A. The illustrative embodiment of the semiconductor device 300 may be, for example, a Dynamic Random Access Memory (DRAM) device. For illustrational simplicity and clarity, some detail/sub-components of the exemplary device are not explicitly labeled in the instant figure. For example, structures under an insulation layer (e.g., insulation layer 245) such as substrate, BL contact holes, and BL stack features are not shown in FIGS. 3A-18A, 3B-18B, 11A-11C.

Figure 3B:
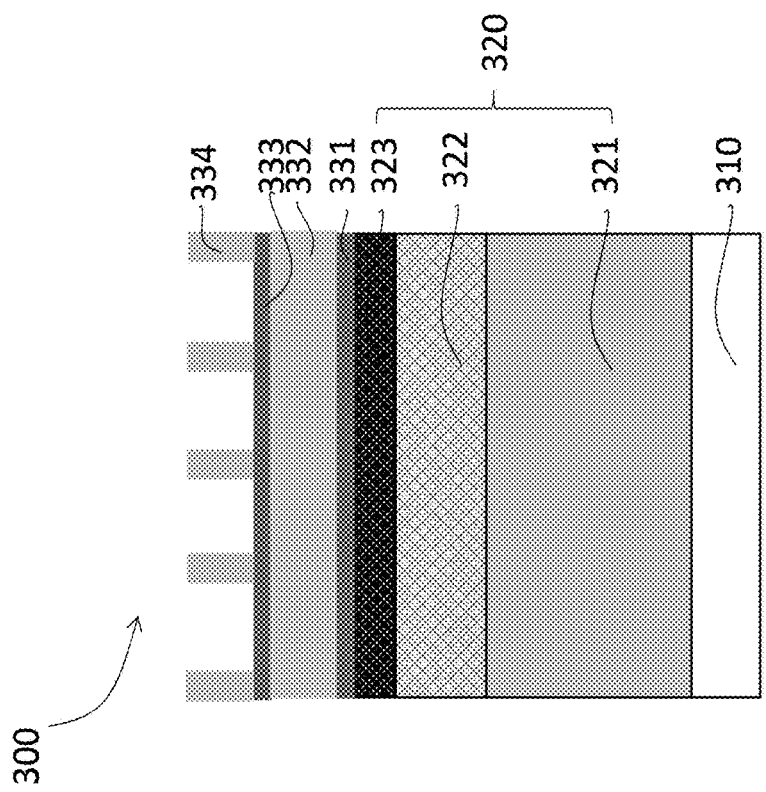
Figure 3A:
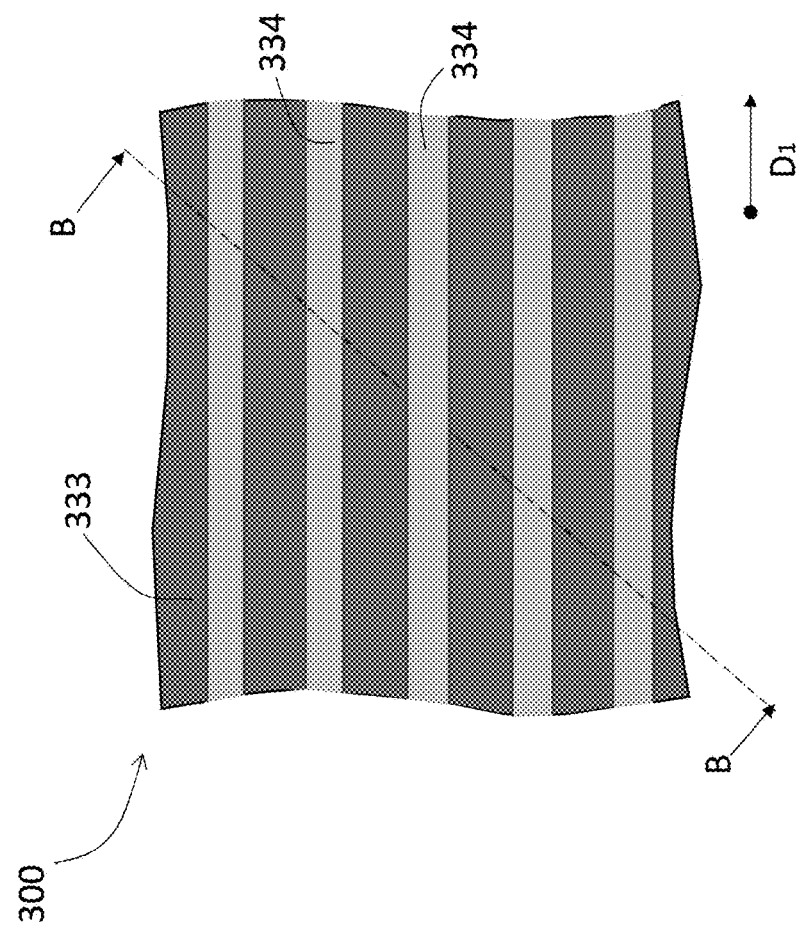

FIGS. 3A and 3B illustrate an intermediate stage of an exemplary fabricating process of a semiconductor structure in accordance with some embodiment. A device layer (target layer) 310 may serve as an interlayer dielectric layer (e.g., insulation layer 245) over a lower device layer (e.g., over the active devices in the active regions 112a/b), through which contact holes (e.g., contact holes 250) are formed to enable vertical connection. In some embodiments, the device layer 310 may serve as a molding layer formed over storage node contacts (e.g., storage node contacts 255) and configured to be patterned to have a plurality of high aspect ratio recess features. A lower electrode (e.g., lower electrode 120L) sequentially disposed in the recess feature may be shaped formed into a cylindrical structure having high aspect ratio.

A mask stack 320 is formed on the device layer 310. In some embodiments, the mask stack 320 may be formed via sequentially depositing a first mask layer 321, a second mask layer 322, and a spin on hard mask layer 323 over the device layer 310. The first mask layer 321 may comprise poly silicon. The second mask layer 322 may comprise silicon oxide. The spin on hard mask layer 323 may comprise carbon. In some embodiments, a thickness of the first mask layer 321 may be in a range from about 50 to 1000 nm. In some embodiments, a thickness of the second mask layer 322 may be in a range from about 100 to 500 nm. In some embodiments, a thickness of the spin on hard mask layer 323 may be in a range from about 50 to 500 nm.

A multi-layered film may be disposed on the mask stack 320. The multi-layered structure may be formed through disposing a first buffer layer 331, a first dummy layer 332, a first dummy mask layer 333 over the mask stack 320. In some embodiments of the instant disclosure, the first buffer layer 331 may include silicon oxide nitride, silicon carbon nitride, or combinations thereof. In some embodiments of the instant disclosure, the first dummy layer 332 may include carbon and be formed via performing a spin on coating process. In some embodiments of the instant disclosure, the first dummy mask layer 333 may include silicon oxide nitride, silicon carbon nitride, or combinations thereof. A thickness of the first dummy mask layer 333 may be in a range from about 10 to 500 nm.

In some embodiments, although not shown, an anti-reflective layer may be further formed on the first dummy mask layer 333. A photoresist layer may be disposed and patterned to form several linear photoresist patterns 334 on the first dummy mask layer 333 abreast each other extending along a first direction $D_1$.

Figure 4B:
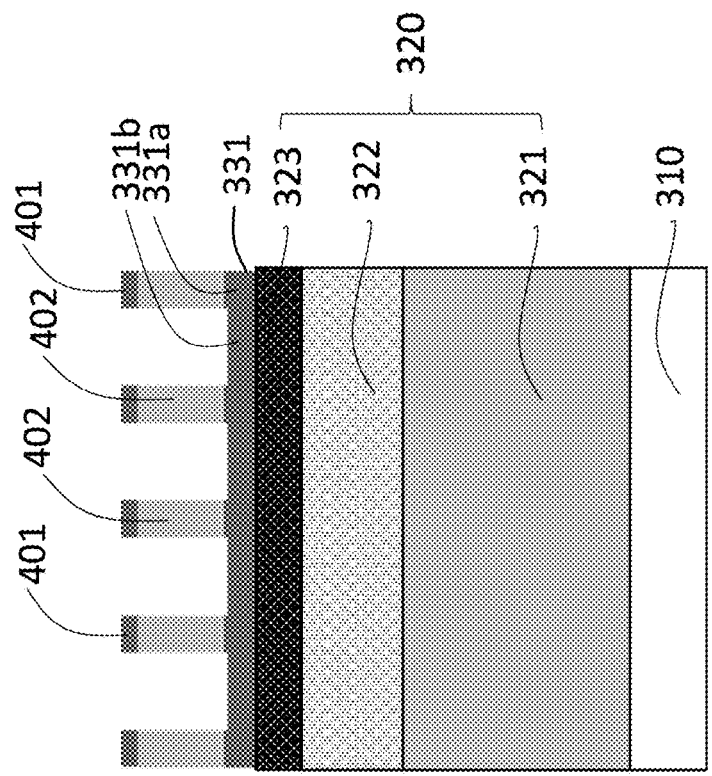
Figure 4A:
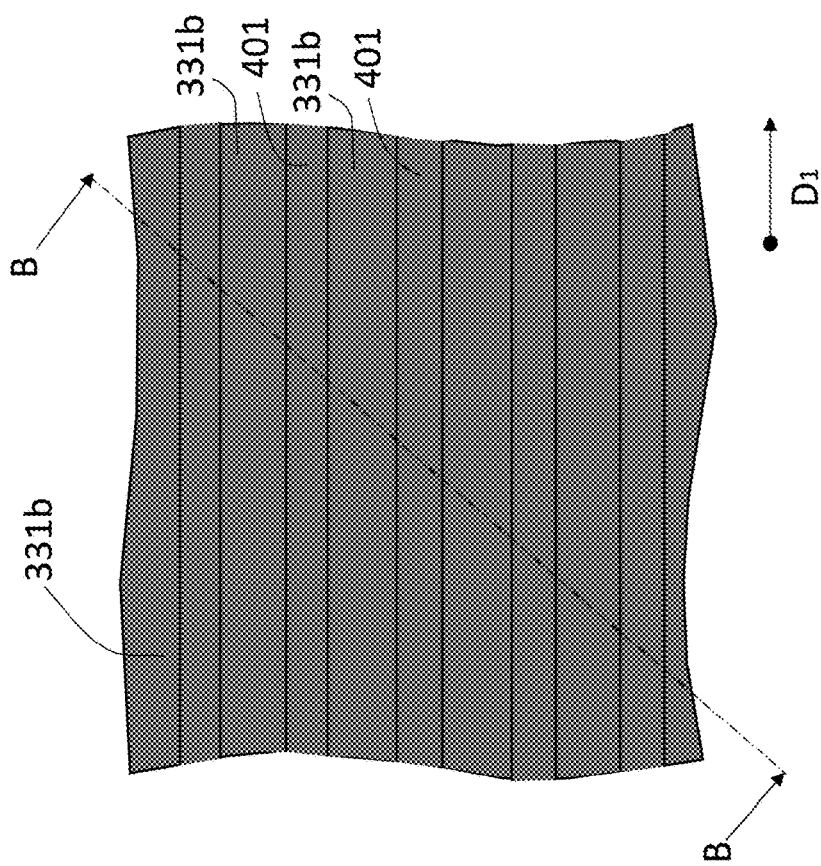

Referring to FIGS. 4A and 4B, the first dummy mask layer 333 may be patterned through the linear photoresist patterns 334 to form a plurality of first preliminary linear features 401 abreast each other extending along the first direction $D_1$.

Next, the exposed portions of first dummy layer 332 between the first preliminary linear features 401 maybe etched through the linear features 401 to partially expose the first buffer layer 331. As such, a plurality of first linear dummy features 402 are formed on the first buffer layer 331. The first linear dummy features 402 are abreast each other and extending along the first direction $D_1$. In some scenarios, when the first dummy layer 332 is recessed, the exposed portions 331b of the first buffer layer 331 may be recessed concurrently such that the exposed portions 331b become lower than portions 331a of the first buffer layer 331 (under the first linear dummy features 402). The linear photoresist patterns 334 may be removed by, for example, an ashing process.

Figure 5B:
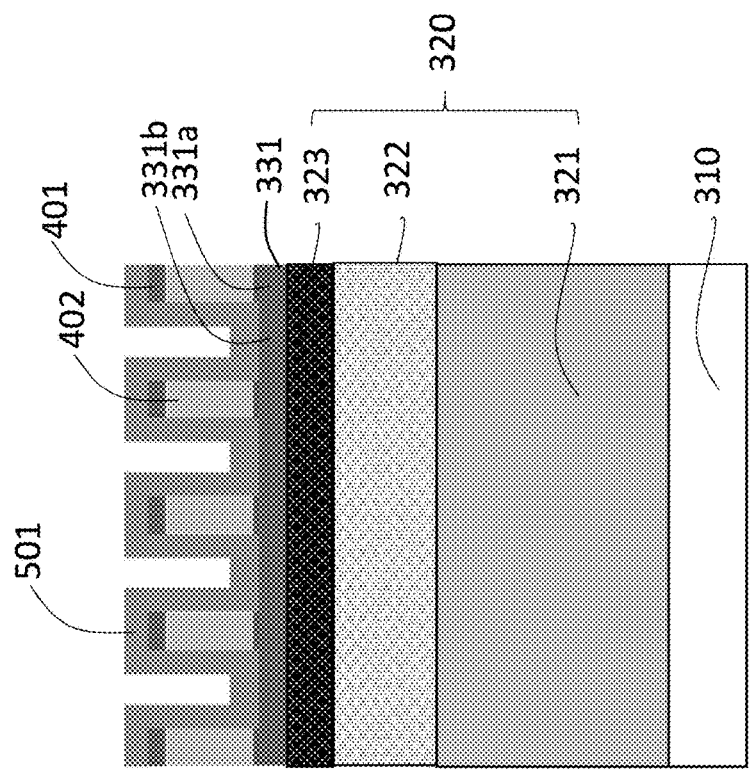
Figure 5A:
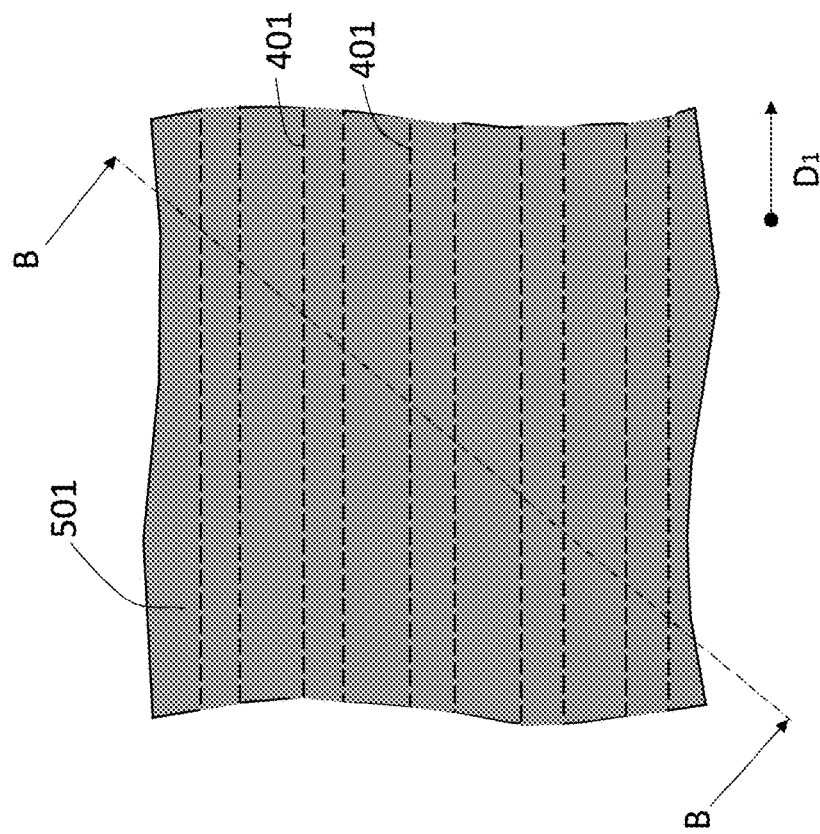

Referring to FIGS. 5A and 5B, a first liner layer (first spacer layer) 501 is formed and conformally lining over and between the first linear dummy features 402 (and over the first buffer layer 331). In some embodiments of the instant disclosure, the first liner layer 501 may be formed through performing an atomic layer deposition (ALD). In some embodiments, the first liner layer 501 may comprise silicon oxide and be referred as to a first oxide layer.

Figure 6B:
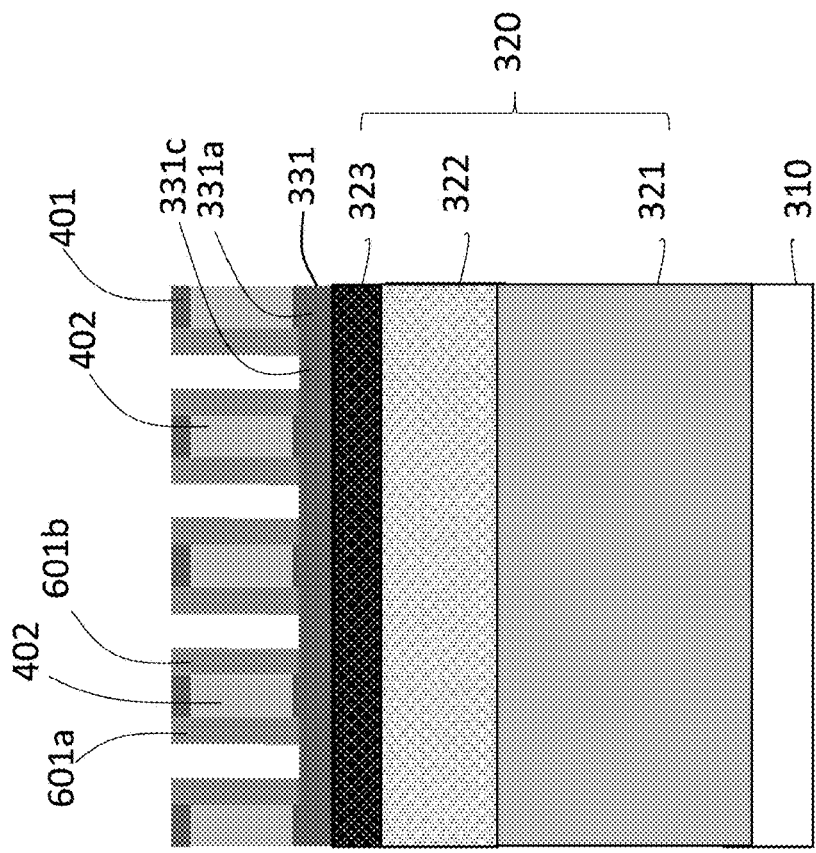
Figure 6A:
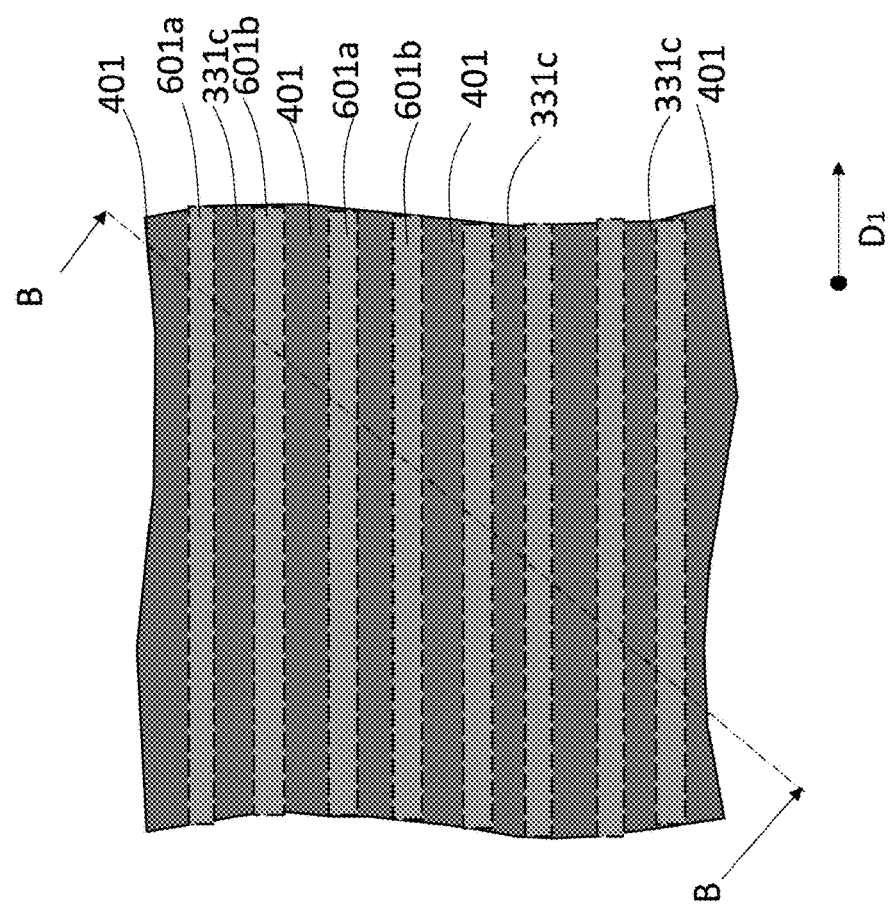

Referring to FIGS. 6A and 6B, an anisotropic etching operation is performed to remove horizontal portions of the first liner layer 501 on and between the first linear dummy features 402, such that a plurality pairs of first linear patterns 601a, 601b are formed. Each pair of the first linear patterns 601a, 601b is self-aligned with and covering both sidewalls of a corresponding first linear dummy feature 402.

Figure 7B:
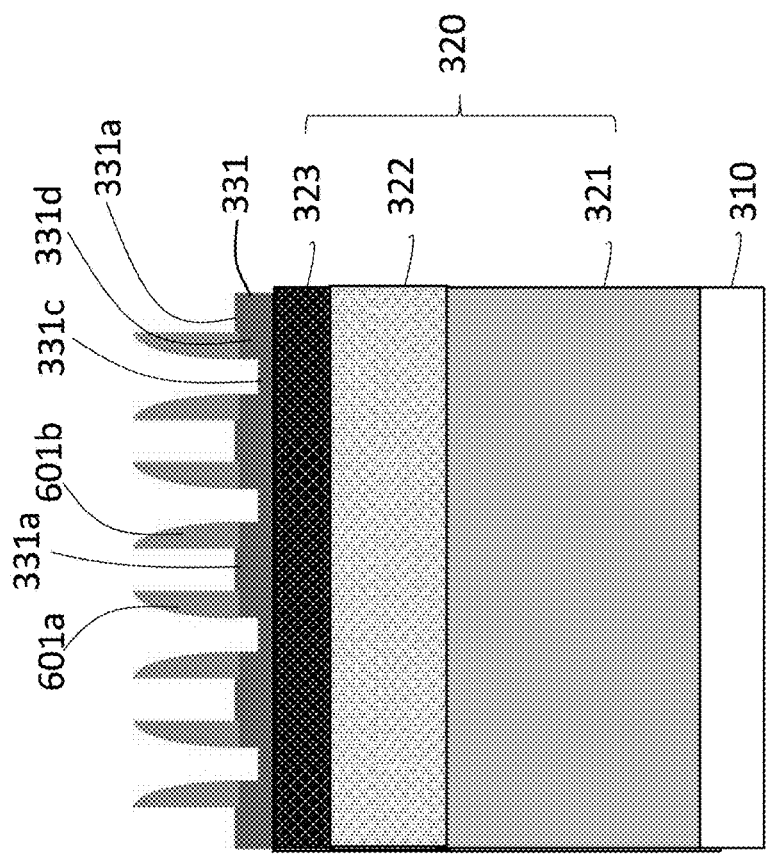
Figure 7A:
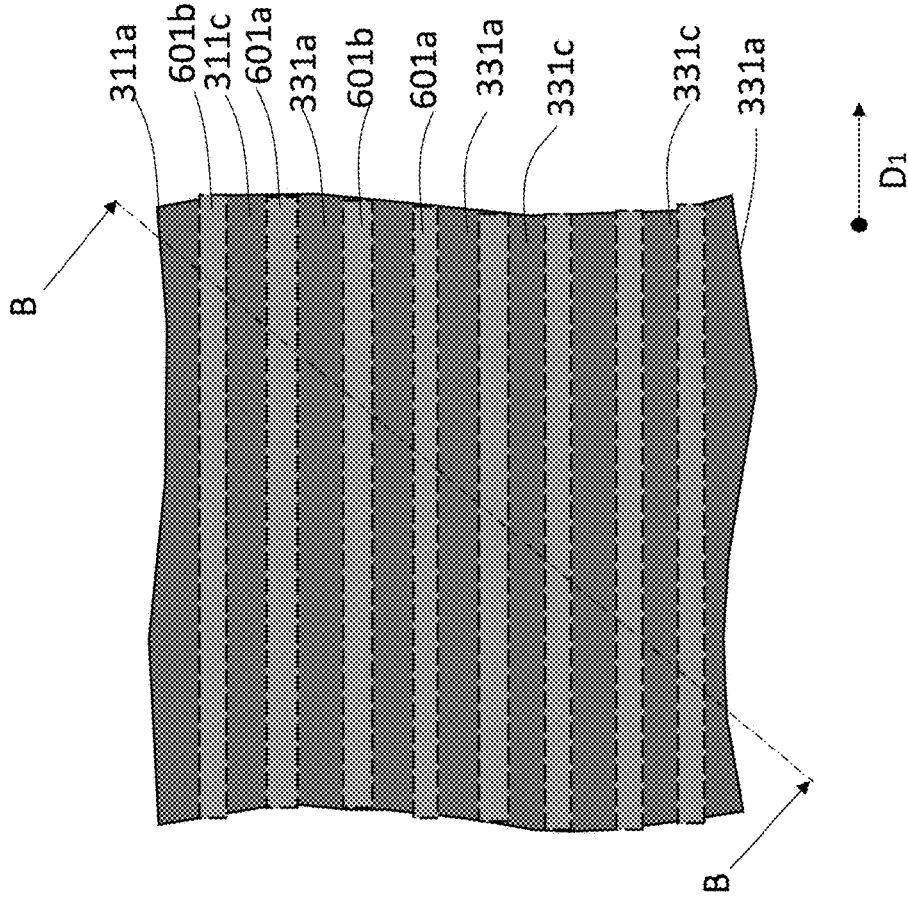

FIGS. 7A and 7B shows a dummy removal process, in which an anisotropic etch is performed to remove the linear features 401 on top of the first dummy features 401. The edge portions of the first linear patterns 601a, 601b may be removed during the etch operation, thereby generating a wedge profile as shown. In some scenarios, the exposed portions 311c of the first buffer layer 311 are recessed concurrently, such that the exposed portions 311c become lower than the portions 311d (covered by the first linear patterns 601a, 601b). In some embodiments, the first pre-liminary linear features 401 are removed concurrently or by individual process to expose the first linear dummy features 402. Subsequently, the exposed first linear dummy features 402 may be removed by, for example, an ashing process. Portions 311a of the first buffer layer 311 (between the first linear features 601a/b) are thus exposed.

Figure 8B:
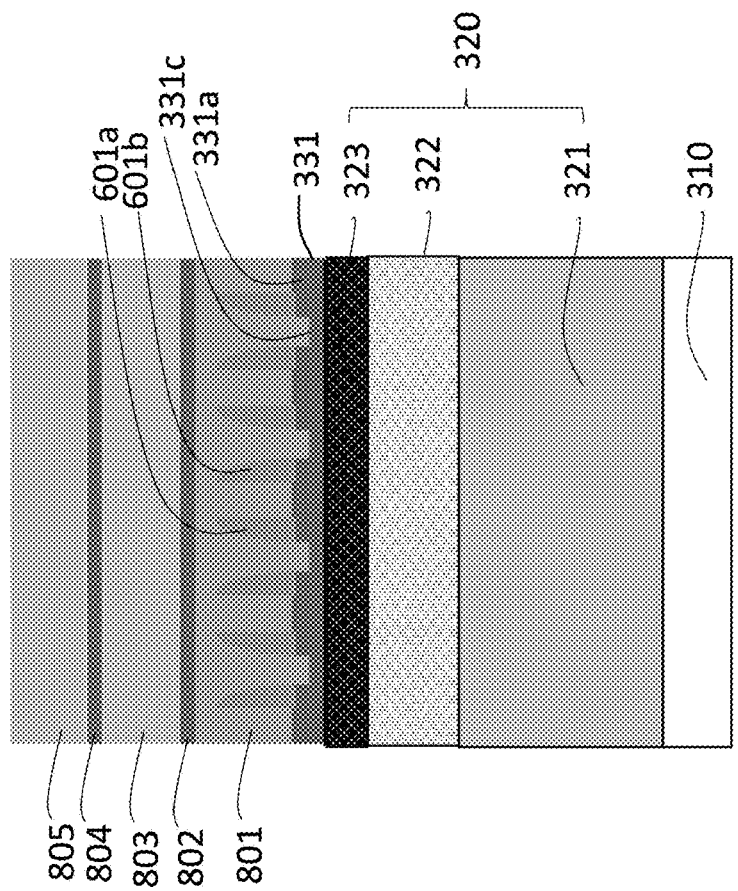
Figure 8A:
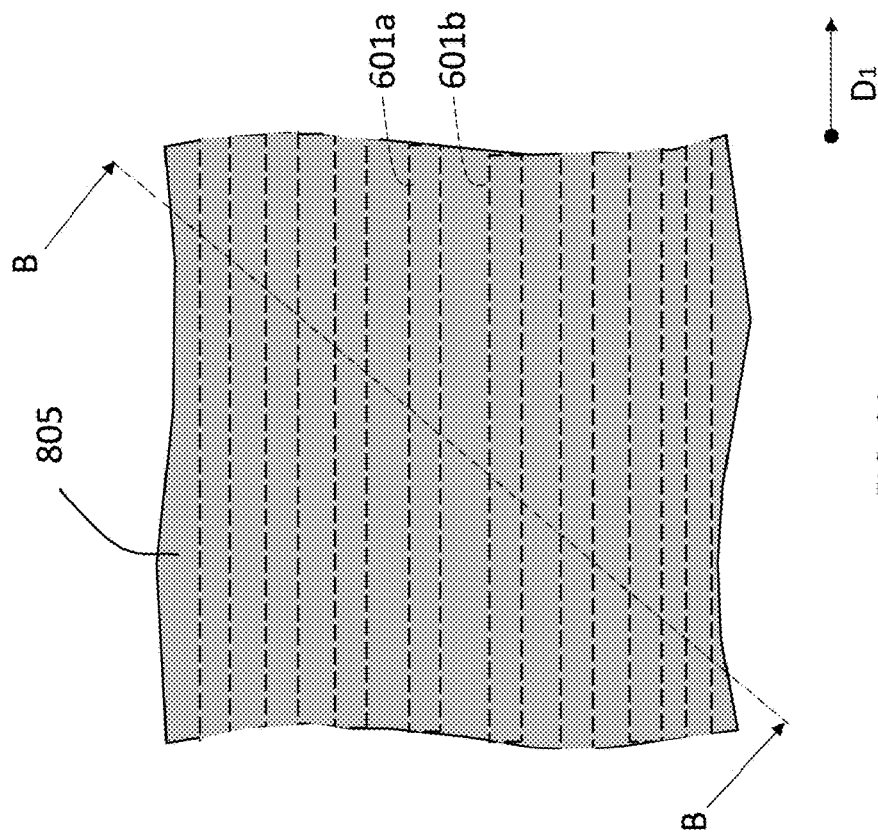

Referring to FIGS. 8A and 8B, a multi-layered structure is disposed to cover the exposed first linear patterns 601a, 601b. In some embodiments, a spin on hard mask layer 801 (which fills the gaps between the first linear patterns 601a, 601b), a second buffer layer 802, a second dummy layer 803, a second dummy mask layer 804, and a photoresist layer 805 are sequentially disposed on the first buffer layer 311. In some embodiments of the instant disclosure, spin on hard mask layer 801 may comprise carbon. The second buffer layer 802 may comprise silicon oxide nitride, silicon carbon nitride, or combinations thereof. In some embodiments of the instant disclosure, the second dummy layer 803 may include carbon and formed via performing a spin on coating process. In some embodiments of the instant disclosure, the second dummy mask layer 804 may comprise silicon oxide nitride, silicon carbon nitride, or combinations thereof.

Figure 9B:
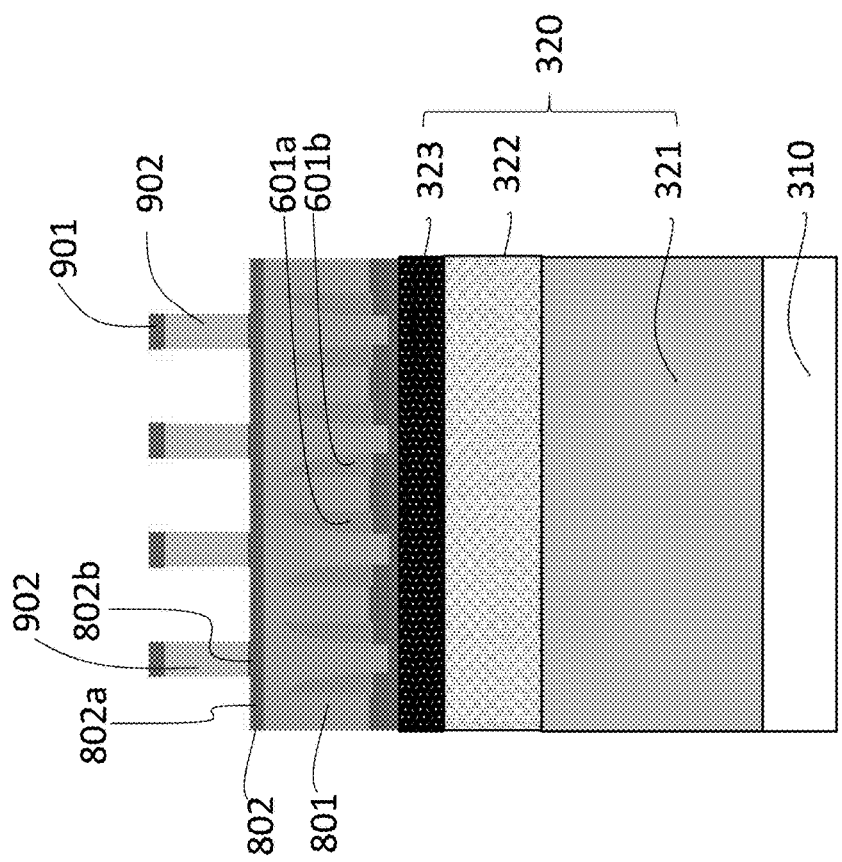
Figure 9A:
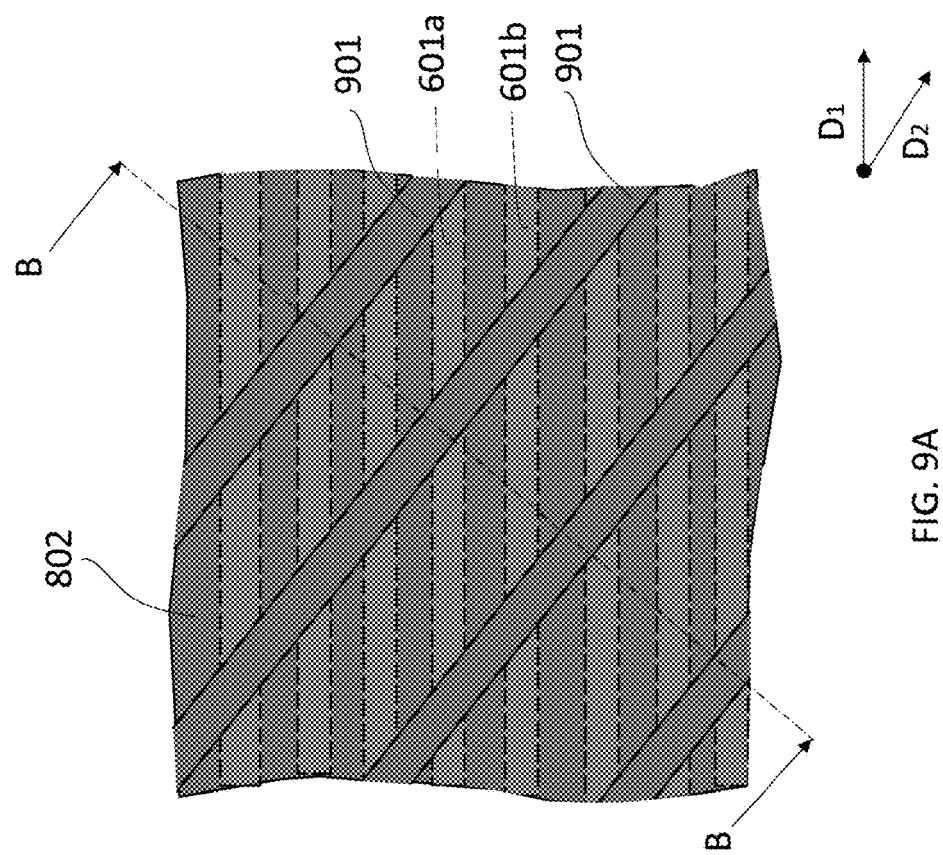

Referring to FIGS. 9A and 9B, similar to the process of patterning the first preliminary linear features 401 (shown in FIG. 4B), the second dummy mask layer 804 is patterned to form a plurality of second preliminary linear features 901 abreast each other extending in a second direction $D_2$ that projectively intercepts the first direction $D_1$.

The exposed portions of second dummy layer 803 are etched through the second preliminary linear features 901 to partially expose the second buffer layer 802. As such, a plurality of second linear dummy features 902 are formed on the second buffer layer 802 abreast each other and extending along the second direction $D_2$. In some scenarios, the exposed portions 802a of the second buffer layer 802 are etched concurrently such that the exposed portions 802a become lower than portions 802b of the second buffer layer 802 (under the second linear dummy features 902).

Figure 10B:
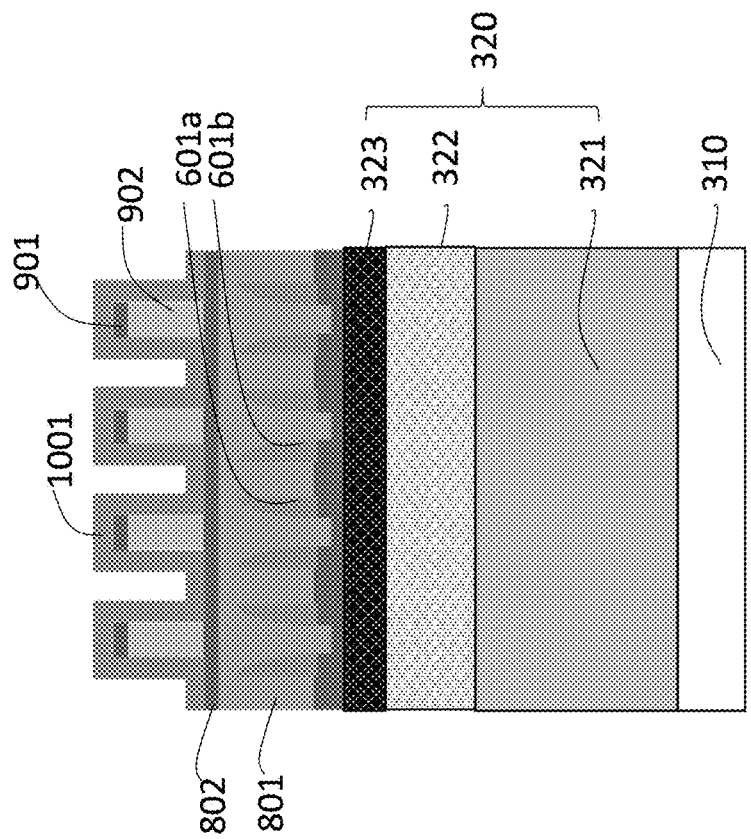
Figure 10A:
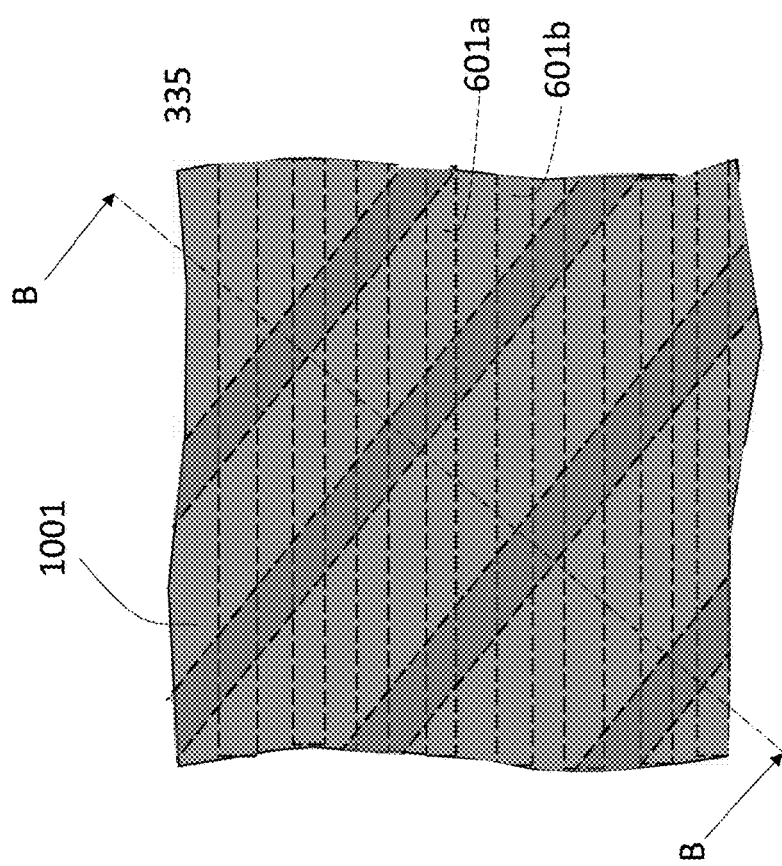

Referring to FIGS. 10A and 10B, a second liner layer (second spacer layer) 1001 is disposed and conformally lining over and between the second linear dummy features 902 (and over the second buffer layer 802). In some embodiments of the instant disclosure, the second liner layer 1001 may be formed via atomic layer deposition technique. In some embodiments, the second liner layer 1001 may comprise silicon oxide and be referred as to a second oxide layer.

Figure 11C:
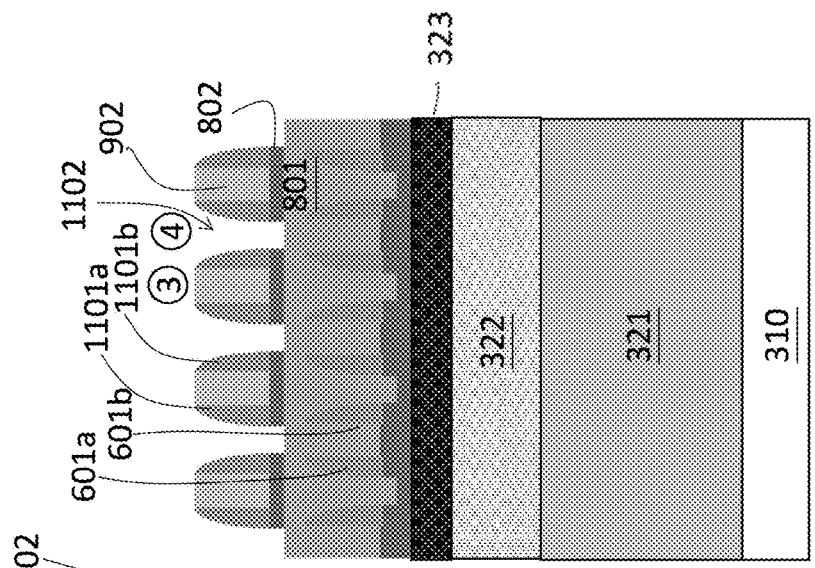
Figure 11B:
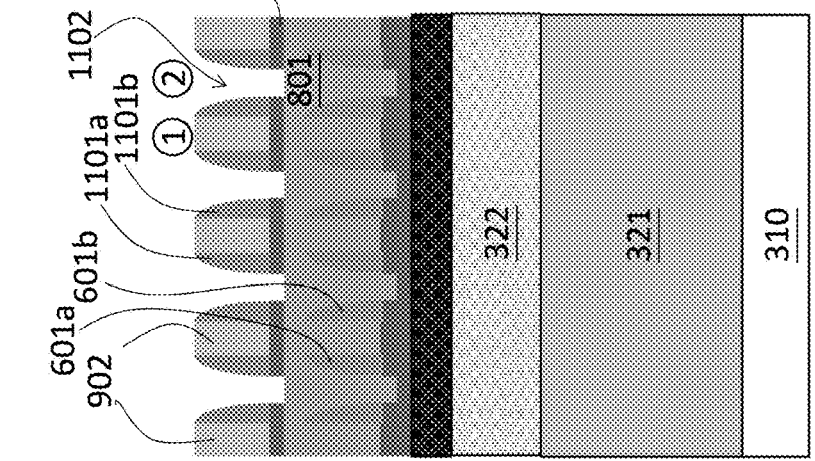
Figure 11A:
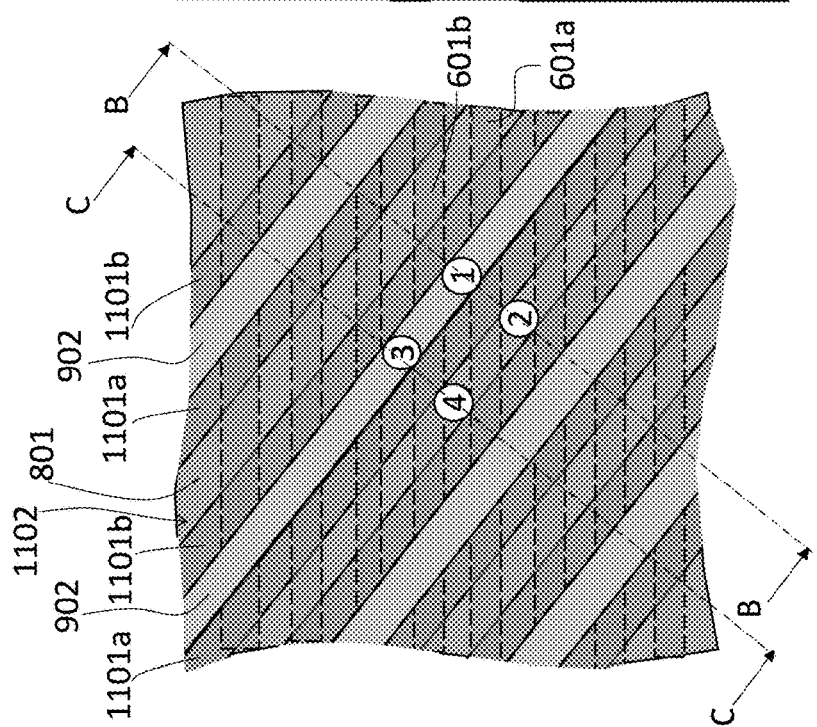

FIGS. 11A, 11B, and 11C show an intermediate stage of fabricating process of a semiconductor. The FIGS. 11B and 11C are cross-sectional views respectively taken along a cut-line B-B and a cut-line C-C indicated in FIG. 11A. in particular, the cut-line B-B passes through each second linear pattern 1001a(1001b) at a portion thereof that intercepts with a corresponding first linear pattern 601a(601b). A cut-line C-C passes through each second linear pattern 1001a(1001b) at a portion thereof that intercepts with a corresponding first linear pattern 601b(601a).

Referring to FIGS. 11A, 11B, and 11C, an anisotropic etching operation is performed to remove horizontal portions of the second liner layer 101 on and between the second linear dummy features 902, such that a plurality pairs of second linear patterns 1101a, 1101b are formed. Each pair of the second linear patterns 1101a, 1101b is self-aligned with and covering both sidewalls of a corresponding second linear dummy features 902. In some embodiments, edge portions of the second linear patterns 1101a, 1101b may be removed via performing an anisotropic etching operation. In some embodiments, the second preliminary linear features 901 are removed concurrently or by individual process such that the second linear dummy features 902 are exposed. Two adjacent pairs of the second linear patterns 1101a, 1101b defines an inter-pairs gap 1102 there-between. The portions of the second buffer layer 802 exposed from the inter-pairs gaps 1102 are then recessed to expose portions of the spin on hard mask layer 801.

Referring to FIGS. 12A, 12B, and 12C, the exposed portions of the spin on hard mask layer 801 under the inter-pairs gaps 1102 between the second linear patterns 1101a, 1101b are recessed through the second linear patterns 1101a, 1101b and the first linear patterns 601a, 601b to expose portions of the first buffer layer 331. In addition, the second linear dummy features 902 are removed to expose portions of the second buffer layer 802 such that each pair of the second linear patterns 1101a, 1101b defines an intra-pair opening 1201.

Referring to FIGS. 13A, 13B, and 13C, the exposed portions of the second buffer layer 802 under the intra-pair openings 1201 are etched through the second linear patterns 1101a, 1101b to expose portions of the spin on hard mask layer 801 under the intra-pair openings 1201. In addition, the exposed portions of first buffer layer 331 under the inter-pairs gaps 1102 are removed through the first linear patterns 601a, 601b and the second linear patterns 1101a, 1101b to expose portions of the mask stack 320 (e.g., the spin on hard mask layer 323) under the inter-pairs gaps 1102.

Figures 14A, 14B, 14C:
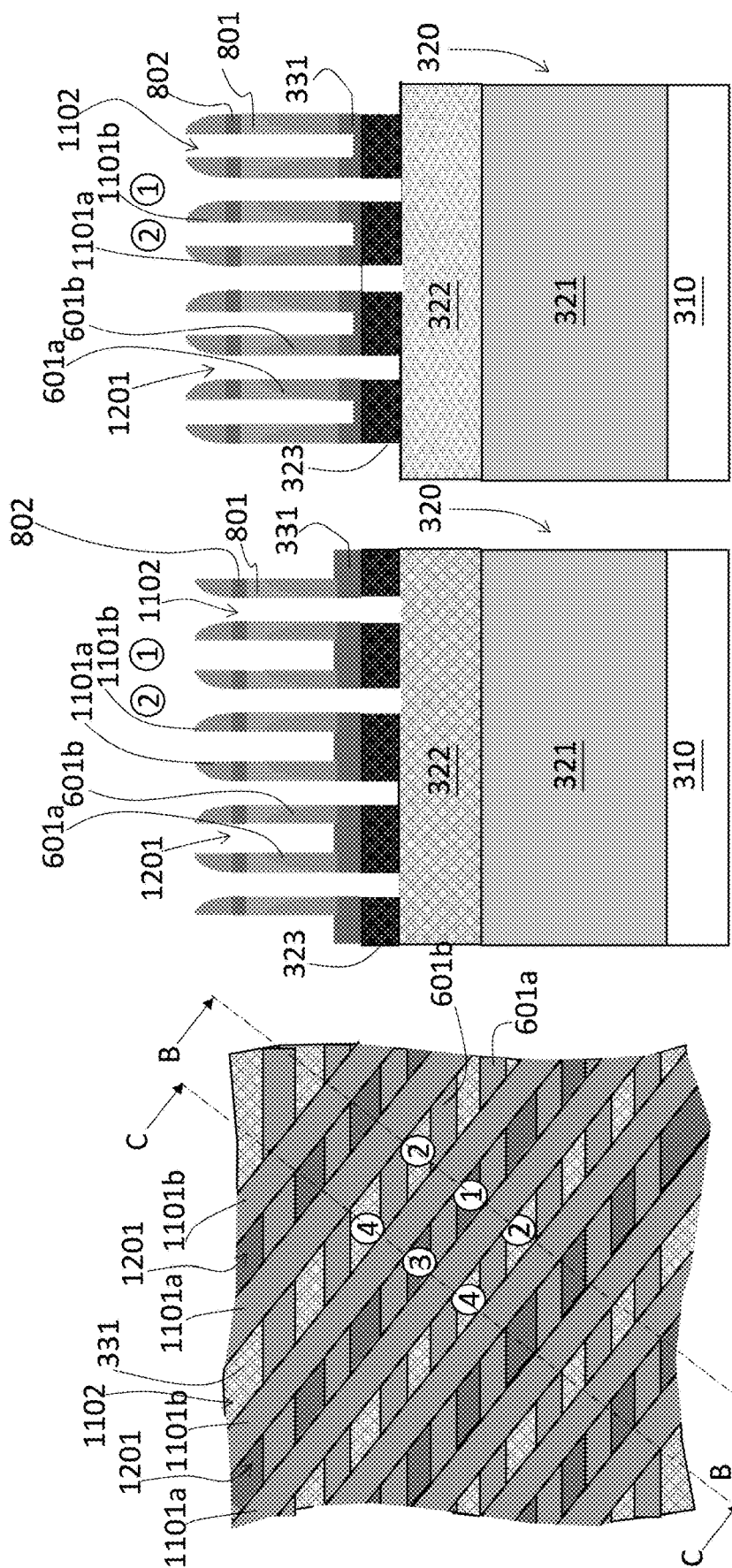

Referring to FIGS. 14A, 14B, and 14C, the exposed portions of the spin on hard mask layer 801 (e.g., at the intra-pair openings 1201) are etched to expose portions of the first buffer layer 331 there-under through the second linear patterns 1101a, 1101b and the first linear patterns 601a, 601b. As such, the pattern defined by the second linear patterns 1101a, 1101b is transferred to the recessed spin on hard mask layer 801. In some scenarios, the exposed portions of the mask stack 320 exposed from the inter-pairs gaps 1102 may be etched concurrently. For instance, the spin on hard mask layer 323 of the mask stack 320 may be etched to partially expose the second mask layer 322.

Referring to FIGS. 15A, 15B, and 15C, the exposed portions of the first buffer layer 331 at the intra-pair openings 1201 are etched to expose portions of mask stack 320 exposed from intra-pair openings 1201 through the second linear patterns 1101a, 1101b and the first linear patterns 601a, 601b. In some scenarios, exposed portions of the mask stack 320 (e.g., exposed from the inter-pairs gaps 1102) may be further recessed concurrently. For instance, exposed portions of the second mask layer 322 exposed from the inter-pairs gaps 1102 may be recessed. In some scenarios, second linear patterns 1101a, 1101b and the remaining portions of the second buffer layer 802 may be removed such that remaining portions of the spin on hard mask layer 801 that overlaps with the second linear patterns 1101a, 1101b are exposed.

Figure 16C:
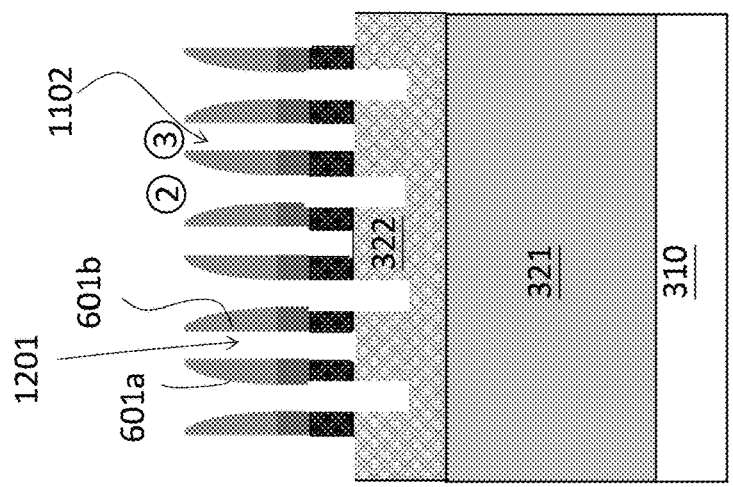
Figure 16B:
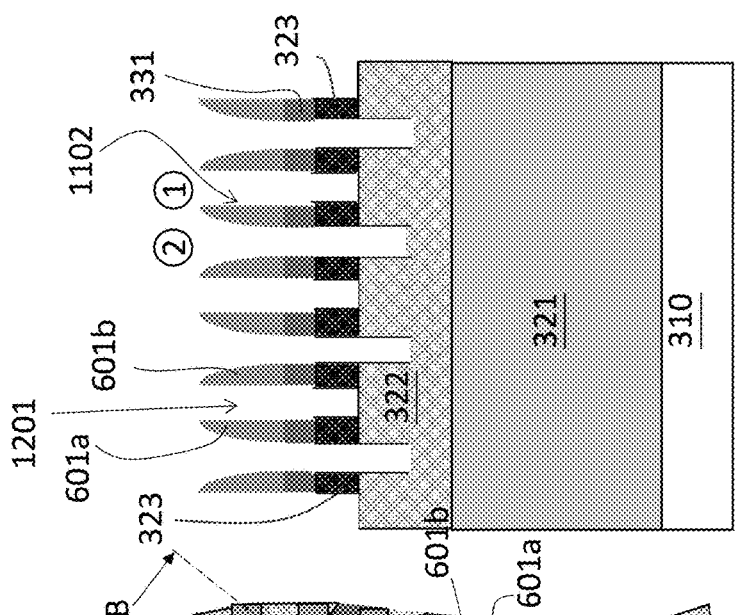
Figure 16A:
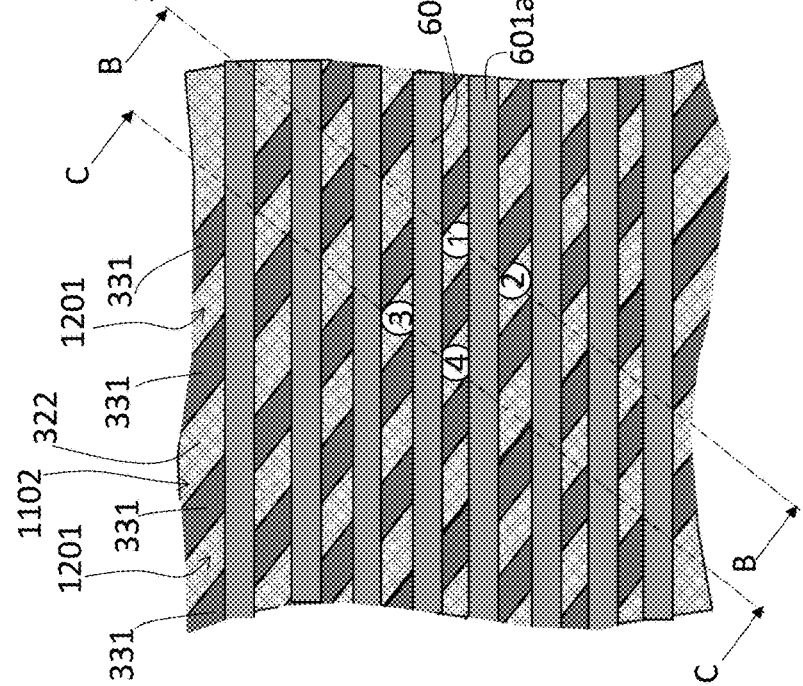
Figure 18B:
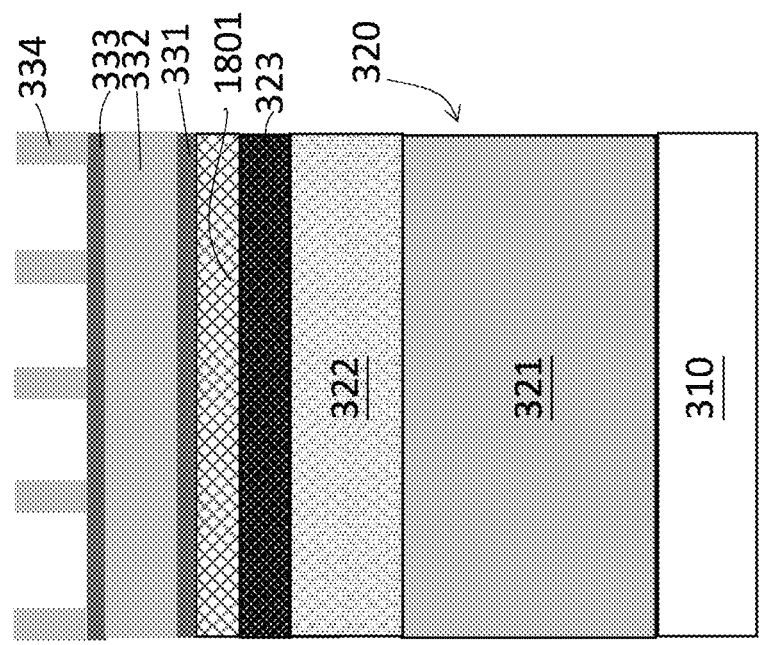
Figure 18A:
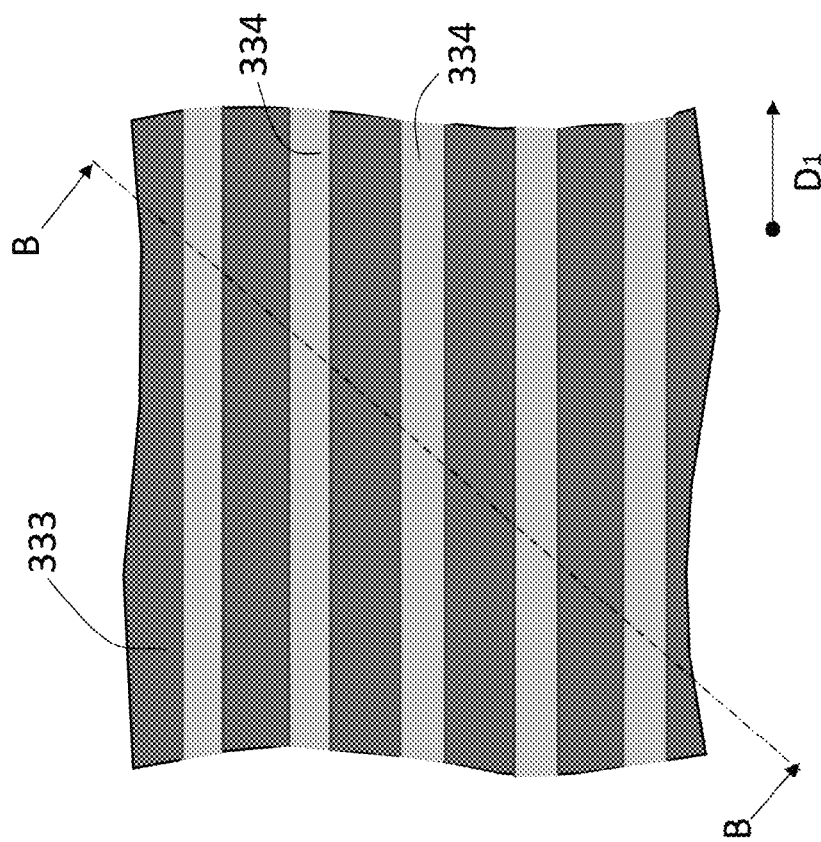

Referring to FIGS. 16A, 16B, and 16C, the exposed portions of the spin on hard mask layer 323 (e.g., exposed from the intra-pair openings 1201) are recessed to expose portions of the second mask layer 322 through the remained portions of the spin on hard mask layer 801 and the first linear patterns 601a, 601b. The portions of the second mask layer 322 exposed from the intra-pair openings 1201 and the inter-pairs gaps 1102 are exposed. Accordingly, a target pattern that is cooperatively defined by the projectively overlapping first and the second linear pattern features 601a/601b, 1101a/1101b may be transferred to the spin on hard mask layer 323.

Referring to FIGS. 17A, 17B, and 17C, the exposed portions of the second mask layer 322 under the intra-pair openings 1201 and inter-pairs gaps 1102 are recessed to expose portions of the first mask layer 321 there-under. Accordingly, the target pattern defined by the projectively overlapping first and the second linear pattern features 601a, 601b, 1101a, 1101b is transferred to the second mask layer 322 and the first mask layer 321.

In some scenarios, the portions of the first mask layer 321 under the inter-pairs gaps 1102 are recessed during the process, thus a thickness variation in the first mask layer 321 may occur. For example, top surfaces $S_{inter}$ of the portions of the first mask layer 321 exposed from the inter-pairs gaps 1102 become lower than top surfaces $S_{intra}$ of the portions exposed from the intra-pair openings 1201.

The first mask layer 321 may be further recessed to form an etching mask for transferring the target pattern to the device layer 310. The device layer 310 may be etched through the etching mask (i.e., the recessed first mask layer 321) to generate contact holes at regions (e.g., regions ①, ②, ③ and ④) that overlaps with the inter-pairs gaps 1102 and intra-pair openings 1201. However, the thickness variation in the first mask layer 321 may result in adverse effect during contact hole formation process (e.g., causing uniformity imbalance in critical dimension) in the device layer 310.

FIGS. 18A-25A, 18B-25B, and 19C-25C show exemplary intermediate stages of a semiconductor device in accordance with some embodiments of the instant disclosure.

In particular, the FIGS. 18A-25A, 18B-25B, and 19C-25C show exemplary fabrication processes of patterning an inter-layer dielectric layer (e.g., insulation layer 245) to form contact holes (e.g., contact holes 250) for accommodating storage node contacts (e.g., storage node contacts 255) in accordance with some embodiments of the instant disclosure. Particularly, FIGS. 18B-25B are cross-sectional views respectively taken along a cut-line B-B indicated in FIGS. 18A-25A. The FIGS. 19C-25C are cross-sectional views respectively taken along a cut-line C-C indicated in FIGS. 19A-25A. For illustrational simplicity and clarity, some detail/sub components of the exemplary device are not explicitly labeled in the instant figure. For example, structures under the insulation layer (e.g., insulation layer 245) such as substrate, BL contact holes, and BL stack features are not shown in FIGS. 18A-25A, 18B-25B, and 19C-25C.

Referring to FIGS. 18 A and 18B, a mid layer 1801 is formed on a mask stack (e.g., the mask stack 320). Subsequently, a first buffer layer 331, a first dummy layer 332, and a first dummy mask layer 333 are sequentially formed over the mid layer 1801.

The mid layer 1801 may also be referred as to a pre-mask etch stop layer. In some embodiments of the instant disclosure, the mid layer 1801 comprises material having etch selectivity to silicon nitride, silicon-nitride family, silicon-nitride series or a combination thereof. In some embodiments of the instant disclosure, the mid layer may selectively comprise $Si_3N_4$, SiCN, SiBN, poly silicon and poly-doped $Si_3N_4$. In some embodiments of the instant disclosure, the mid layer 1801 may be disposed with a thickness in a range from about 10 to 500 nm.

Figure 19C:
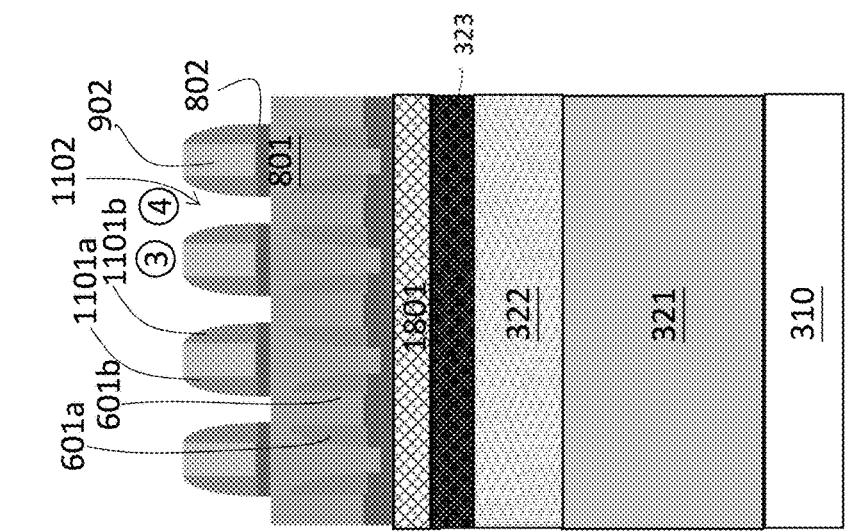
Figure 19B:
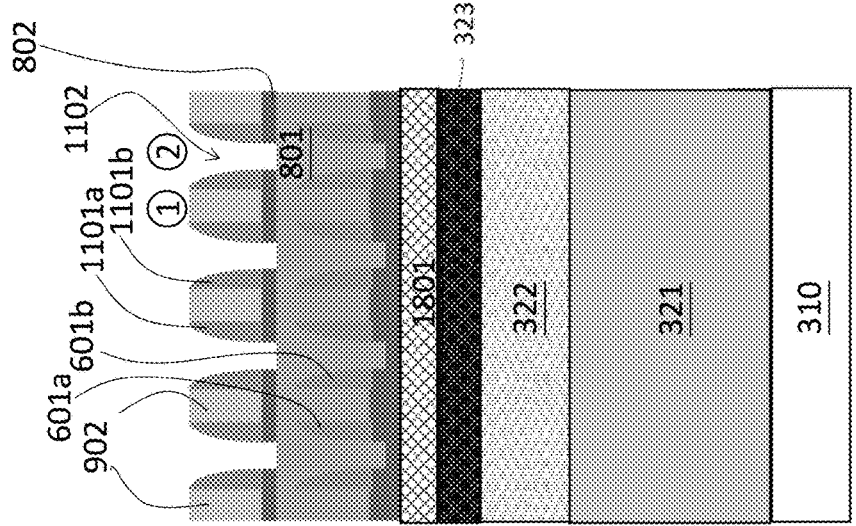
Figure 19A:
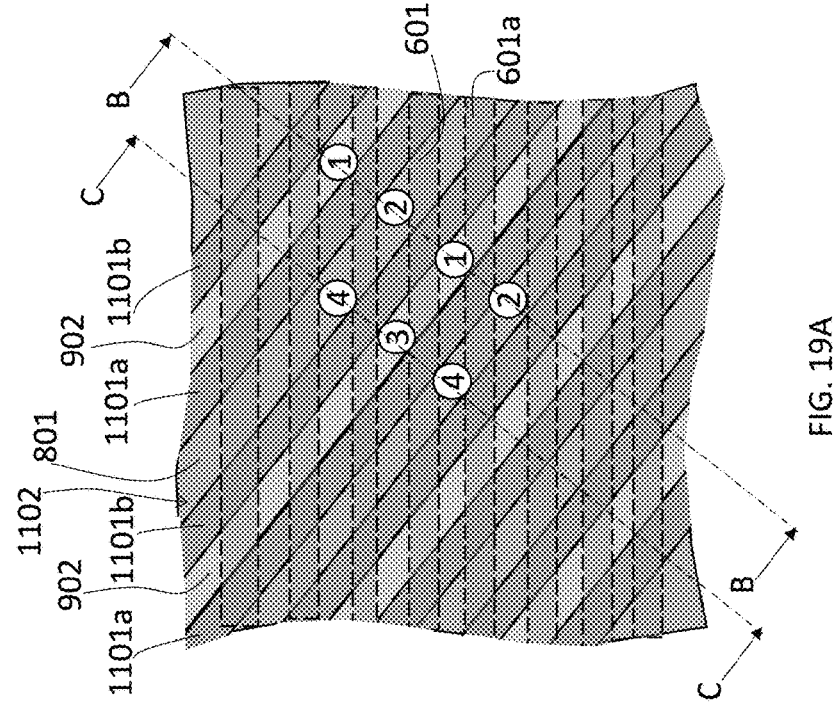

Referring to FIGS. 19A, 19B and 19C, first linear patterns 601a, 601b, a spin on hard mask layer 801, a second buffer layer 802, second linear dummy features 902 and second linear patterns 1101a, 1101b may be formed using processes discussed in accordance with the aforementioned embodiments (for example, processes described in association with FIG. 3A-11A).

Subsequently, a mid layer opening process is performed to partially expose the mid layer 1801 and to recess the exposed portions of the mid layer 1801. Accordingly, a grid-type pattern over the mask stack 320 is formed (as shown in FIG. 19A). In particular, in order to partially expose the mid layer 1801, the second linear dummy features 902, the second buffer layer 902, the spin on hard mask layer 801, and the first buffer layer 331 are concurrently etched (through the first linear patterns 601a, 601b and the second linear patterns 1101a, 1101b). Details of the mid layer opening process may be described in FIGS. 20A-24A, 20B-24B, and 20C-24C.

In some embodiments, the first and the second linear patterns 601a, 601b, 1101a, 1101b may comprise silicon oxide. In such embodiments, the first and the second linear patterns 601a, 601b, 1101a, 1101b are referred as to first and the second oxide linear patterns, respectively. During mid layer opening process, the projectively intercepting first and second oxide linear patterns cooperatively form as an oxide grid pattern over the mid layer 1801.

Referring to FIGS. 20A, 20B and 20C, etching process described with the accompanying drawings such as FIGS. 12A, 12B, and 12C is performed. As a result, portions of the first buffer layer 331 under inter-pairs gaps 1102 and portions of the second buffer layer 802 under intra-pair openings 1201 are exposed.

Referring to FIGS. 21A, 21B and 21C, etching process described with the accompanying drawings such as FIGS. 13A, 13B, and 13C is performed. As a result, portions of the spin on hard mask layer 801 under intra-pair openings 1201 and portions of the mid layer 1801 under the inter-pairs gaps 1102 are exposed.

Referring to FIGS. 22A, 22B, and 22C, etching process described with the accompanying drawings such as FIGS. 14A, 14B, and 14C are performed. As a result, portions of the first buffer layer 331 under intra-pair openings 1201 are exposed. However, the mask stack 320 is protected by the mid layer 1801.

Figure 23C:
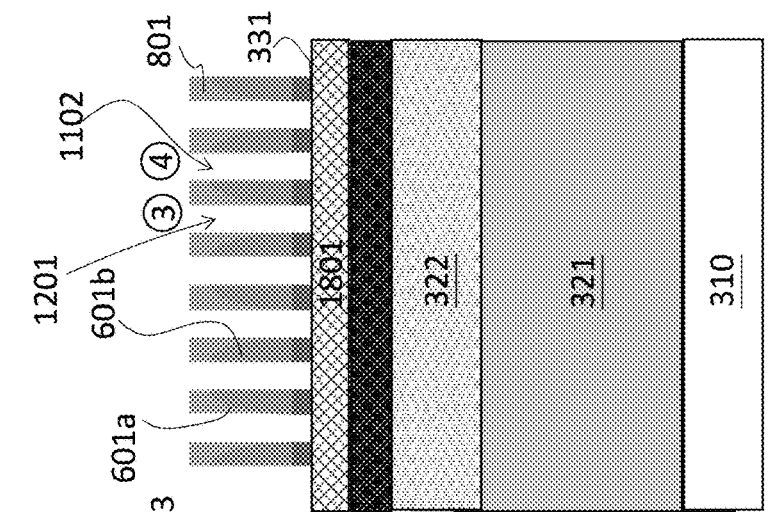
Figure 23B:
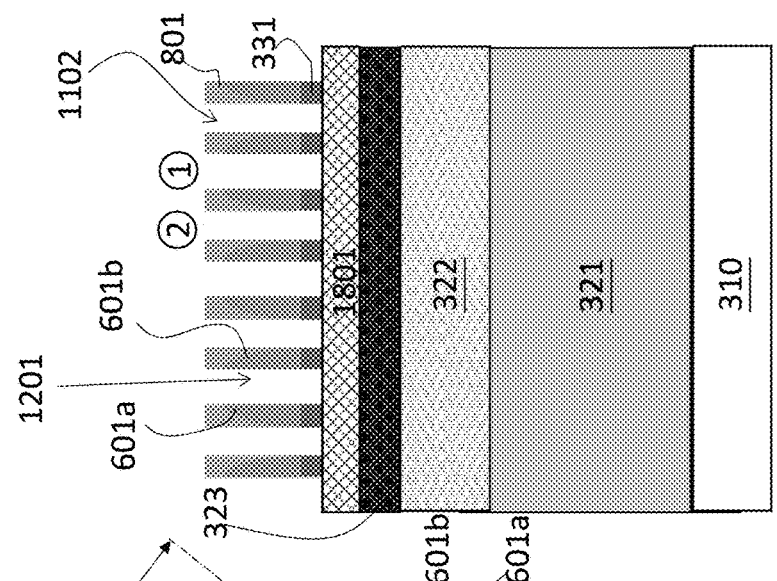
Figure 23A:
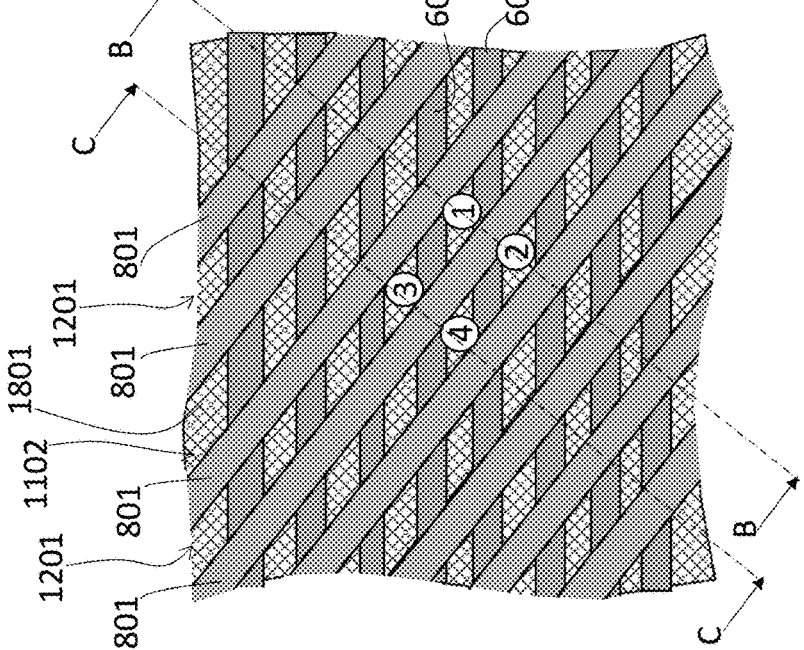

Referring to FIGS. 23A, 23B, and 23C, etching process described with the accompanying drawings such as FIGS. 15A, 15B, and 15C are performed. Portions of the first buffer layer 331 under the intra-pair openings 1201 are recessed. As a result, portions of the mid layer 1801 under intra-pair openings 1201 are exposed. However, the mask stack 320 is protected by the mid layer 1801.

Figure 24C:
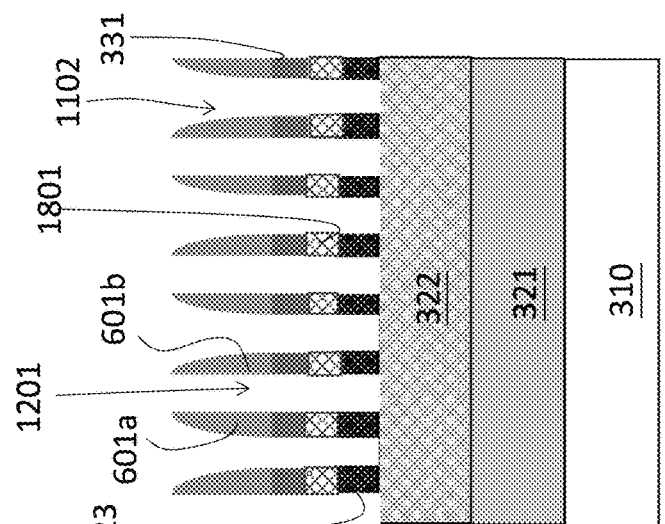
Figure 24B:
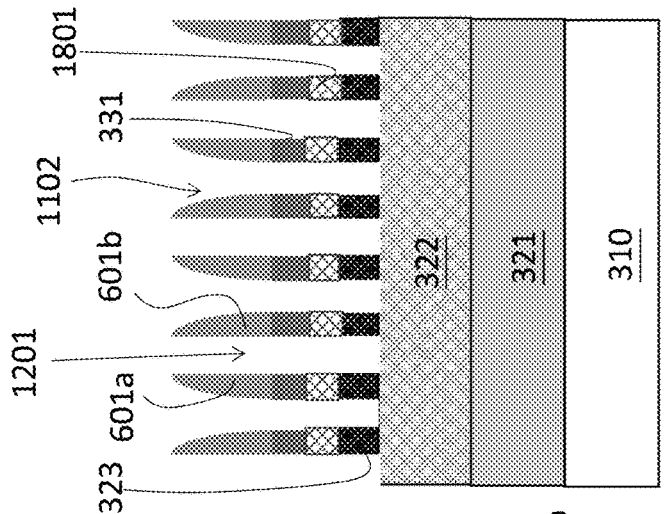
Figure 24A:
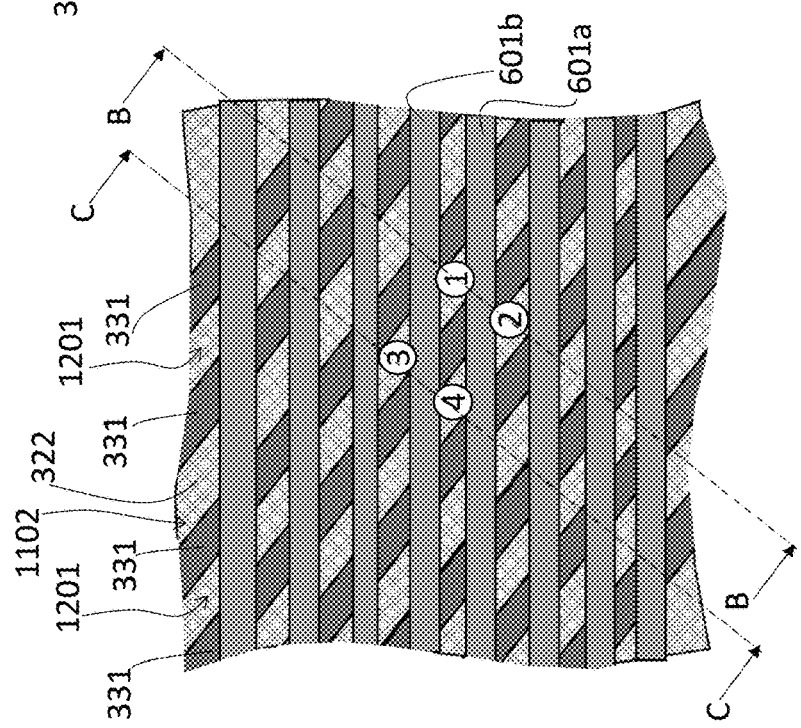

Referring to FIGS. 24A, 24B, and 24C, the exposed portions of the mid layer 1801 under the intra-pair openings 1201 and the inter-pairs gaps 1102 are recessed to form a grid-type pattern over the mask stack 320. The grid-type pattern projectively overlapping the first and the second linear patterns 601a, 601b, 1101a, 1101b. In some embodiments, the spin on hard mask layer 323 is recessed concurrently or by individual processes to partially expose the second mask layer 322.

It is worth mentioning that during the mid layer opening process (e.g., processes illustrated in FIGS. 20A-24A, 20B-24B, and 20C-24C), top portion of the mask stack 320 (e.g., the spin on hard mask layer 323) is protected by the mid layer 320. Therefore, thicknesses of the mask stack 320 (in particular, the spin on hard mask layer 323) may be maintained substantially uniform. As a result, when the spin on hard mask layer 323 is partially etched to expose the second mask layer 322, the thicknesses of the second mask layer 322 may be maintained substantially uniform.

Referring to FIGS. 25A, 25B, and 25C, etching process may be similar to that described with respect to FIGS. 17A, 17B, and 17C are performed. The exposed portions of the second mask layer 322 under the intra-pair openings 1201 and the inter-pairs gaps 1102 are recessed to expose portions of the first mask layer 321 under the intra-pair opening 1201 and the inter-pairs gaps 1102. In some embodiments, remaining portions of the first linear patterns 601a, 601b, the first buffer layer 331, and the mid layer 1801 may be removed concurrently or by individual processes.

Top surfaces $S_{inter}$ of the portions of the first mask layer 321 under the inter-pairs gaps 1102 are substantially at a same level with top surfaces $S_{intra}$ of the portions under the intra-pair openings 1201. Due to the thickness uniformity of the first mask layer 321, the quality of the subsequentially generated contact holes in the device layer 310 is improved.

Accordingly, some embodiments of instant disclosure provides a method of fabrication a semiconductor device comprises forming a mask stack (e.g., mask stack 320) over a device layer (e.g., device layer 310); forming a mid layer (e.g., mid layer 1801) over the mask stack; forming a first buffer layer (e.g., device layer 331) on the mid layer; forming a plurality of lower linear patterns (e.g., first linear patterns 601a, 601b or first linear dummy features 402) on the first buffer layer abreast each other extending in a first direction different from the first direction; sequentially deposing a spin on hard mask layer (e.g., spin on hard mask layer 801) filling between the lower linear patterns, and a second buffer layer (e.g., second buffer layer 802) on the spin on hard mask layer; forming a plurality of upper linear patterns (e.g., upper linear patterns 1101a, 1101b or second linear dummy features 902) on the second buffer layer abreast each other extending along a second direction that projectively intercepts the first direction; performing a mid layer opening process by concurrently etching the second buffer layer, the spin on hard mask layer, and the first buffer layer through the lower linear patterns and the upper linear patterns to partially expose the mid layer; and etching the exposed portions of the mid layer to form a grid-type pattern over the mask stack.

Accordingly, one aspect of the instant disclosure provides a method of fabricating semiconductor device. The method comprises forming a mask stack over a device layer of a substrate; forming a mid layer over the mask stack; forming a first buffer layer on the mid layer; forming a plurality of first linear dummy features on the first buffer layer abreast each other extending along a first direction; forming a first liner layer conformally lining over and between the first linear dummy features and over the first buffer layer; forming a plurality pairs of first linear patterns by performing anisotropic etching operation that removes horizontal portions of the first liner layer on and between the first linear dummy features, each pair of the first linear patterns respectively covering both sidewalls of the first linear dummy features; removing the first linear dummy features; sequentially deposing a spin on hard mask layer filling between the first linear patterns, and a second buffer layer on the spin on hard mask layer; forming a plurality of second linear dummy features on the second buffer layer abreast each other extending along a second direction that projectively intercepts the first direction; forming a second liner layer conformally lining over and between the second linear dummy features and over the second buffer layer; forming a plurality pairs of second linear patterns by performing anisotropic etching operation that removes horizontal portions of the second liner layer, each pair of the second linear patterns respectively covering both sidewalls of the second linear dummy features; performing a mid layer opening process by concurrently etching the second linear dummy features, the second buffer layer, the spin on hard mask layer, and the first buffer layer through the first linear patterns and the second linear patterns to partially expose the mid layer; and etching the exposed portions of the mid layer to form a grid-type pattern over the mask stack.

In some embodiments of the instant disclosure, the forming the first linear dummy features comprises sequentially disposing a first dummy layer and a first dummy mask layer on the first buffer layer; patterning the first dummy mask layer to form a plurality of first preliminary linear features abreast each other extending along the first direction; and etching the exposed portions of first dummy layer through the first preliminary linear features to partially expose the first buffer layer such that the first linear dummy features are formed, wherein the exposed portions of the first buffer layer are recessed concurrently such that the exposed portions are lower than portions of the first buffer layer under the first linear dummy features.

In some embodiments of the instant disclosure, the forming the first linear patterns further comprises performing an anisotropic etching operation to remove edge portions of the first linear patterns, wherein the exposed portions of the first buffer layer are recessed concurrently, such that the exposed portions are lower than the portions covered by the first linear patterns; and removing the first preliminary linear features such that the first linear dummy features are exposed.

In some embodiments of the instant disclosure, the forming the first liner layer comprises performing atomic layer deposition to form the first liner layer, wherein the first liner layer comprises silicon oxide.

In some embodiments of the instant disclosure, the first dummy layer is formed via performing a spin on coating process; the first dummy layer includes carbon.

In some embodiments of the instant disclosure, the first dummy mask layer comprises silicon nitride.

In some embodiments of the instant disclosure, the forming the second linear dummy features comprises sequentially disposing a second dummy layer and a second dummy mask layer on the second buffer layer; patterning the second dummy mask layer to form a plurality of second preliminary linear features abreast each other extending in the second direction; and etching the exposed portions of second dummy layer through the second preliminary linear features to partially expose the second buffer layer such that the second linear dummy features are formed, wherein the exposed portions of the second buffer layer are etched concurrently such that the exposed portions are lower than portions of the second buffer layer under the second linear dummy features.

In some embodiments of the instant disclosure, the forming the second linear patterns comprises performing an anisotropic etching operation to remove edge portions of the second linear patterns; removing the second preliminary linear features such that the second linear dummy features are exposed.

In some embodiments of the instant disclosure, the forming the second liner layer comprises performing atomic layer deposition to form the second liner layer, wherein the second liner layer comprises silicon oxide.

In some embodiments of the instant disclosure, the second dummy layer is formed via performing a spin on coating process; the second dummy layer includes carbon.

In some embodiments of the instant disclosure, the second dummy mask layer comprises silicon nitride.

In some embodiments of the instant disclosure, the mid layer opening process comprises recessing the exposed portions of the second buffer layer under a plurality of inter-pairs gaps to expose portions of the spin on hard mask layer, wherein each one of the inter-pairs gaps is defined between adjacent pairs of the second linear patterns; recessing the exposed portions of the spin on hard mask layer under the inter-pairs gaps between the second linear patterns through the second linear patterns and the first linear patterns to expose portions of the first buffer layer; removing the second linear dummy features to expose portions of the second buffer layer such that each pair of the second linear patterns defines an intra-pair opening; recessing the exposed portions of the second buffer layer under the intra-pair openings through the second linear patterns to expose portions of the spin on hard mask layer under the openings; recessing the exposed portions of first buffer layer under the inter-pairs gaps through the first linear patterns and the second linear patterns to expose portions of the mid layer under the inter-pairs gaps; recessing the exposed portions of the spin on hard mask layer under the intra-pair openings to expose portions of the first buffer layer under the intra-pair openings through the second linear patterns and the first linear patterns; and recessing the exposed portions of the first buffer layer under the intra-pair openings to expose portions of mid layer under the intra-pair openings through the second linear patterns and the first linear patterns.

In some embodiments of the instant disclosure, the recessing the exposed portions of the first buffer layer under the intra-pair openings comprises removing the second linear patterns and remained portions of the second buffer layer under the second linear patterns to expose remained portions of the spin on hard mask layer under the second linear patterns.

In some embodiments of the instant disclosure, the mid layer comprises material having selectivity to silicon nitride.

In some embodiments of the instant disclosure, the forming the mid layer comprises forming the mid layer having a thickness in a range from about 10 to 500 nm.

In some embodiments of the instant disclosure, the forming the mask stack comprises sequentially forming a first mask layer comprising poly silicon and a second mask layer comprising silicon oxide, and a spin on hard mask layer on the device layer.

In some embodiments of the instant disclosure, the mid layer selectively comprises $Si_3N_4$, SiCN, SiBN, and poly silicon.

Accordingly, one aspect of the instant disclosure provides a method. The method comprises forming a mask stack over a device layer; forming a mid layer over the mask stack; forming a first buffer layer on the mid layer; forming a plurality of first linear dummy features abreast each other along a first direction; forming a first oxide layer conformally lining over and between the first linear dummy features and over the first buffer layer; forming a plurality pairs of first oxide linear patterns by performing anisotropic etching operation to remove horizontal portions of the first oxide layers, each pair of the first oxide linear patterns covers both sidewalls of the first linear dummy features; sequentially deposing a spin on hard mask layer covering the first linear oxide patterns, and a second buffer layer on the spin on hard mask layer; forming a plurality of second linear dummy features abreast each other along a second direction that projectively intercepts the first direction; forming a second oxide layer conformally lining over and between the second linear dummy features and over the second buffer layer; forming a plurality pairs of second oxide linear patterns by performing anisotropic etching operation to remove horizontal portions of the second oxide layers, each pair of the second oxide linear patterns covers both sidewalls of the second linear dummy features; performing a mid layer opening process by concurrently etching the second linear dummy features, the second buffer layer, the spin on hard mask layer, and the first buffer layer through a oxide grid pattern comprising the first oxide linear patterns and the second oxide linear patterns to partially expose the mid layer; and etching the exposed portions of the mid layer to form a grid-type pattern over the mask stack.

In some embodiments of the instant disclosure, wherein the mid layer comprises material having selectivity to silicon nitride.

Accordingly, one aspect of instant disclosure provides a method. The method comprises forming a mask stack over a device layer; forming a mid layer over the mask stack; forming a first buffer layer on the mid layer; forming a plurality of lower linear patterns on the first buffer layer abreast each other extending in a first direction different from the first direction; sequentially depositing a spin on hard mask layer filling between the lower linear patterns, and a second buffer layer on the spin on hard mask layer; forming a plurality of upper linear patterns on the second buffer layer abreast each other extending along a second direction that projectively intercepts the first direction; performing a mid layer opening process by concurrently etching the second buffer layer, the spin on hard mask layer, and the first buffer layer through the lower linear patterns and the upper linear patterns to partially expose the mid layer; and etching the exposed portions of the mid layer to form a grid-type pattern over the mask stack.

The embodiments shown and described above are only examples. Many details are often found in the art such as the other features of a radiation measurement panel and device. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A method of fabricating semiconductor device, comprising:
    forming a mask stack over a device layer of a substrate;
    forming a mid layer over the mask stack;
    forming a first buffer layer on the mid layer;
    forming a plurality of first linear dummy features on the first buffer layer abreast each other and extending along a first direction;
    forming a first liner layer conformally lining over and between the first linear dummy features and over the first buffer layer;
    forming a plurality pairs of first linear patterns by performing anisotropic etching operation that removes horizontal portions of the first liner layer on and between the first linear dummy features, each pair of the first linear patterns respectively covering both sidewalls of the first linear dummy features;
    removing the first linear dummy features;
    sequentially depositing a spin on hard mask layer filling between the first linear patterns, and a second buffer layer on the spin on hard mask layer;
    forming a plurality of second linear dummy features on the second buffer layer abreast each other and extending along a second direction that intersects with the first direction;
    forming a second liner layer conformally lining over and between the second linear dummy features and over the second buffer layer;
    forming a plurality pairs of second linear patterns by performing anisotropic etching operation that removes horizontal portions of the second liner layer, each pair of the second linear patterns respectively covering both sidewalls of the second linear dummy features;
    performing a mid layer opening process by concurrently etching the second linear dummy features, the second buffer layer, the spin on hard mask layer, and the first buffer layer through the first linear patterns and the second linear patterns to partially expose the mid layer; and
    etching the exposed portions of the mid layer to form a grid-type pattern over the mask stack.

2. The method of claim 1, wherein the forming the first linear dummy features comprises:
    sequentially disposing a first dummy layer and a first dummy mask layer on the first buffer layer;
    patterning the first dummy mask layer to form a plurality of first preliminary linear features abreast each other extending along the first direction; and
    etching the exposed portions of first dummy layer through the first preliminary linear features to partially expose the first buffer layer such that the first linear dummy features are formed, wherein the exposed portions of the first buffer layer are recessed concurrently such that the exposed portions are lower than portions of the first buffer layer under the first linear dummy features.

3. The method of claim 2, wherein the forming the first linear patterns further comprises:
    performing an anisotropic etching operation to remove edge portions of the first linear patterns, wherein the exposed portions of the first buffer layer are recessed concurrently such that the exposed portions are lower than the portions covered by the first linear patterns; and
    removing the first preliminary linear features such that the first linear dummy features are exposed.

4. The method of claim 3,
    wherein the forming the first liner layer comprises performing atomic layer deposition to form the first liner layer, wherein the first liner layer comprises silicon oxide.

5. The method of claim 3,
    wherein the first dummy layer is formed via performing a spin on coating process;
    wherein the first dummy layer includes carbon.

6. The method of claim 3,
    wherein the first dummy mask layer comprises silicon nitride.

7. The method of claim 1, wherein the forming the second linear dummy features comprises:
    sequentially disposing a second dummy layer and a second dummy mask layer on the second buffer layer;
    patterning the second dummy mask layer to form a plurality of second preliminary linear features abreast each other extending in the second direction; and
    etching the exposed portions of second dummy layer through the second preliminary linear features to partially expose the second buffer layer such that the second linear dummy features are formed, wherein the exposed portions of the second buffer layer are etched concurrently such that the exposed portions are lower than portions of the second buffer layer under the second linear dummy features.

8. The method of claim 7, wherein the forming the second linear patterns comprises:
performing an anisotropic etching operation to remove edge portions of the second linear patterns; and
removing the second preliminary linear features such that the second linear dummy features are exposed.

9. The method of claim 7,
wherein the second dummy layer is formed via performing a spin on coating process;
wherein the second dummy layer includes carbon.

10. The method of claim 1,
wherein the forming the second liner layer comprises performing atomic layer deposition to form the second liner layer, wherein the second liner layer comprises silicon oxide.

11. The method of claim 1,
wherein the second dummy mask layer comprises silicon nitride.

12. The method of claim 1, wherein the mid layer opening process comprises:
recessing the exposed portions of the second buffer layer under a plurality of inter-pairs gaps to expose portions of the spin on hard mask layer, wherein each one of the inter-pairs gaps is defined between adjacent pairs of the second linear patterns;
recessing the exposed portions of the spin on hard mask layer under the inter-pairs gaps between the second linear patterns through the second linear patterns and the first linear patterns to expose portions of the first buffer layer;
removing the second linear dummy features to expose portions of the second buffer layer such that each pair of the second linear patterns defines an intra-pair opening;
recessing the exposed portions of the second buffer layer under the intra-pair openings through the second linear patterns to expose portions of the spin on hard mask layer under the openings;
recessing the exposed portions of first buffer layer under the inter-pairs gaps through the first linear patterns and the second linear patterns to expose portions of the mid layer under the inter-pairs gaps;
recessing the exposed portions of the spin on hard mask layer under the intra-pair openings to expose portions of the first buffer layer under the intra-pair openings through the second linear patterns and the first linear patterns; and
recessing the exposed portions of the first buffer layer under the intra-pair openings to expose portions of mid layer under the intra-pair openings through the second linear patterns and the first linear patterns.

13. The method of claim 12,
wherein the recessing the exposed portions of the first buffer layer under the intra-pair openings comprises removing the second linear patterns and remained portions of the second buffer layer under the second linear patterns to expose remained portions of the spin on hard mask layer under the second linear patterns.

14. The method of claim 1,
wherein the mid layer comprises material having selectivity to silicon nitride.

15. The method of claim 14,
wherein the mid layer selectively comprises $Si_3N_4$, SiCN, SiBN, and poly silicon.

16. The method of claim 1, wherein the forming the mid layer comprises:
forming the mid layer having a thickness in a range from about 10 to 500 nm.

17. The method of claim 1,
wherein the forming the mask stack comprises sequentially forming a first mask layer comprising poly silicon and a second mask layer comprising silicon oxide, and a spin on hard mask layer on the device layer.

18. A method, comprising:
forming a mask stack over a device layer;
forming a mid layer over the mask stack;
forming a first buffer layer on the mid layer;
forming a plurality of first linear dummy features abreast each other and extending along a first direction;
forming a first oxide layer conformally lining over and between the first linear dummy features and over the first buffer layer;
forming a plurality pairs of first oxide linear patterns by performing anisotropic etching operation to remove horizontal portions of the first oxide layers, each pair of the first oxide linear patterns covers both sidewalls of the first linear dummy features;
sequentially depositing a spin on hard mask layer covering the first linear oxide patterns, and a second buffer layer on the spin on hard mask layer;
forming a plurality of second linear dummy features abreast each other and extending along a second direction that intersects with the first direction;
forming a second oxide layer conformally lining over and between the second linear dummy features and over the second buffer layer;
forming a plurality pairs of second oxide linear patterns by performing anisotropic etching operation to remove horizontal portions of the second oxide layers, each pair of the second oxide linear patterns covers both sidewalls of the second linear dummy features;
performing a mid layer opening process by concurrently etching the second linear dummy features, the second buffer layer, the spin on hard mask layer, and the first buffer layer through a oxide grid pattern comprising the first oxide linear patterns and the second oxide linear patterns to partially expose the mid layer; and
etching the exposed portions of the mid layer to form a grid-type pattern over the mask stack.

19. The method of claim 18, wherein the mid layer comprises material having selectivity to silicon nitride.

20. A method, comprising:
forming a mask stack over a device layer;
forming a mid layer over the mask stack;
forming a first buffer layer on the mid layer;
forming a plurality of lower linear patterns on the first buffer layer abreast each other and extending in a first direction;
sequentially depositing a spin on hard mask layer filling between the lower linear patterns, and a second buffer layer on the spin on hard mask layer;
forming a plurality of upper linear patterns on the second buffer layer abreast each other and extending along a second direction that intersects with the first direction;
performing a mid layer opening process by concurrently etching the second buffer layer, the spin on hard mask layer, and the first buffer layer through the lower linear patterns and the upper linear patterns to partially expose the mid layer; and etching the exposed portions of the mid layer to form a grid-type pattern over the mask stack.

* * * * *